United States Patent
Olsen et al.

(10) Patent No.: US 7,916,180 B2
(45) Date of Patent: Mar. 29, 2011

(54) SIMULTANEOUS MULTIPLE FIELD OF VIEW DIGITAL CAMERAS

(75) Inventors: Richard Ian Olsen, Irvine, CA (US);
Darryl L. Sato, Irvine, CA (US);
Feng-Qing Sun, Irvine, CA (US); James Gates, Irvine, CA (US)

(73) Assignee: Protarius Filo AG, L.L.C., Dover, DE (US)

( * ) Notice: Subject to any disclaimer, the term of this patent is extended or adjusted under 35 U.S.C. 154(b) by 842 days.

(21) Appl. No.: 11/788,279

(22) Filed: Apr. 19, 2007

(65) Prior Publication Data

US 2010/0060746 A9    Mar. 11, 2010

Related U.S. Application Data

(63) Continuation-in-part of application No. 11/212,803, filed on Aug. 25, 2005, now abandoned.

(60) Provisional application No. 60/795,946, filed on Apr. 28, 2006, provisional application No. 60/695,946, filed on Jul. 1, 2005, provisional application No. 60/604,854, filed on Aug. 25, 2004.

(51) Int. Cl.
*H04N 5/225* (2006.01)
(52) U.S. Cl. .................................... 348/218.1
(58) Field of Classification Search ............... 348/218.1
See application file for complete search history.

(56) References Cited

U.S. PATENT DOCUMENTS

| | | | |
|---|---|---|---|
| 3,609,367 A * | 9/1971 | Barron | 250/349 |
| 3,971,065 A | 7/1976 | Bayer | |
| 4,323,925 A * | 4/1982 | Abell et al. | 348/340 |
| 4,385,373 A | 5/1983 | Howe | |
| 4,894,672 A | 1/1990 | Tanaka | |
| 5,005,083 A | 4/1991 | Grage et al. | |
| 5,051,830 A | 9/1991 | von Hoessle | |
| 5,436,660 A | 7/1995 | Sakamoto | |
| 5,654,752 A | 8/1997 | Yamazaki | |
| 5,691,765 A * | 11/1997 | Schieltz et al. | 348/335 |
| 5,694,165 A | 12/1997 | Yamazaki et al. | |
| 5,742,659 A | 4/1998 | Atac et al. | |

(Continued)

FOREIGN PATENT DOCUMENTS

EP    599470    6/1994

(Continued)

OTHER PUBLICATIONS

Duparre et al., "Theoretical analysis of an artificial superposition compound eye for application in ultra flat digital image acquisition devices," Proceedings of SPIE, vol. 5249, 2004, pp. 408-418.

(Continued)

*Primary Examiner* — James M Hannett

(57) ABSTRACT

Digital camera systems and methods are described that provide digital cameras configured to simultaneously acquire image data via multiple channels having different fields of view. The digital cameras include multiple channels coupled to a processing component. Each channel includes an optics component and an array of sensors or photo-detectors integrated on a semiconductor substrate. The channels include a first channel having a first field of view (FOV) and a second channel having a second FOV, and the second FOV is different than the first FOV. The processing component is configured to independently control simultaneous data acquisition with each of the channels, and to combine data from at least one channel during a frame to provide a high resolution image.

39 Claims, 22 Drawing Sheets

U.S. PATENT DOCUMENTS

| | | | |
|---|---|---|---|
| 5,760,832 A | | 6/1998 | Yamanaka et al. |
| 5,766,980 A | | 6/1998 | Ohtagaki et al. |
| 5,850,479 A | * | 12/1998 | Terry et al. ............... 382/211 |
| 6,137,535 A | | 10/2000 | Meyers |
| 6,375,075 B1 | | 4/2002 | Ackley et al. |
| 6,381,072 B1 | | 4/2002 | Burger |
| 6,429,898 B1 | | 8/2002 | Shoda et al. |
| 6,437,335 B1 | | 8/2002 | Bohn |
| 6,570,613 B1 | | 5/2003 | Howell |
| 6,611,289 B1 | | 8/2003 | Yu et al. |
| 6,617,565 B2 | | 9/2003 | Wu |
| 6,714,239 B2 | | 3/2004 | Guidash |
| 6,727,521 B2 | | 4/2004 | Merrill et al. |
| 6,765,617 B1 | | 7/2004 | Tangen et al. |
| 6,833,873 B1 | | 12/2004 | Suda |
| 6,834,161 B1 | | 12/2004 | Stiehler |
| 6,841,816 B2 | | 1/2005 | Merrill et al. |
| 6,859,299 B1 | | 2/2005 | Chiao |
| 6,882,368 B1 | | 4/2005 | Suda |
| 6,882,864 B2 | | 4/2005 | Miyake |
| 6,885,398 B1 | | 4/2005 | Sladen |
| 6,885,404 B1 | | 4/2005 | Suda |
| 6,885,508 B2 | | 4/2005 | Yamaguchi et al. |
| 6,903,770 B1 | | 6/2005 | Kobayashi et al. |
| 6,946,647 B1 | * | 9/2005 | O'Neill et al. ............ 250/227.2 |
| 6,952,228 B2 | | 10/2005 | Yoneda et al. |
| 6,960,817 B2 | | 11/2005 | Ogura et al. |
| 7,095,159 B2 | | 8/2006 | Machida |
| 7,095,561 B2 | | 8/2006 | Mitchell et al. |
| 7,115,853 B2 | | 10/2006 | Jiang et al. |
| 7,123,298 B2 | | 10/2006 | Schroeder et al. |
| 7,164,113 B2 | | 1/2007 | Inokuma et al. |
| 7,170,665 B2 | | 1/2007 | Kaneko et al. |
| 7,199,348 B2 | | 4/2007 | Olsen et al. |
| 7,214,926 B2 | | 5/2007 | Gruhlke et al. |
| 7,223,954 B2 | | 5/2007 | McNulty |
| 7,236,306 B2 | | 6/2007 | Janson, Jr. et al. |
| 7,239,345 B1 | * | 7/2007 | Rogina ............ 348/218.1 |
| 7,256,944 B2 | | 8/2007 | Labaziewicz et al. |
| 7,280,290 B2 | | 10/2007 | Araki et al. |
| 7,305,180 B2 | | 12/2007 | Labaziewicz et al. |
| 7,358,483 B2 | | 4/2008 | Mitsugi et al. |
| 7,362,357 B2 | | 4/2008 | Brown et al. |
| 7,379,104 B2 | | 5/2008 | Hattori et al. |
| 7,417,674 B2 | | 8/2008 | Gruhlke |
| 7,453,510 B2 | | 11/2008 | Kolehmainen et al. |
| 7,460,160 B2 | | 12/2008 | Hershey et al. |
| 2002/0024606 A1 | * | 2/2002 | Yuki et al. ............. 348/302 |
| 2002/0051071 A1 | | 5/2002 | Itano et al. |
| 2002/0089596 A1 | | 7/2002 | Suda |
| 2002/0113888 A1 | | 8/2002 | Sonoda et al. |
| 2002/0122124 A1 | | 9/2002 | Suda |
| 2003/0020814 A1 | | 1/2003 | Ono |
| 2003/0086013 A1 | | 5/2003 | Aratani |
| 2003/0151685 A1 | | 8/2003 | La Grone |
| 2003/0160886 A1 | | 8/2003 | Misawa et al. |
| 2003/0209651 A1 | | 11/2003 | Iwasaki |
| 2003/0234907 A1 | | 12/2003 | Kawai |
| 2004/0012688 A1 | * | 1/2004 | Tinnerino et al. ......... 348/218.1 |
| 2004/0012689 A1 | * | 1/2004 | Tinnerino et al. ......... 348/218.1 |
| 2004/0027687 A1 | | 2/2004 | Bittner |
| 2004/0080638 A1 | | 4/2004 | Lee |
| 2004/0183918 A1 | | 9/2004 | Squilla et al. |
| 2005/0128509 A1 | | 6/2005 | Tokkonen et al. |
| 2005/0134712 A1 | | 6/2005 | Gruhlke et al. |
| 2005/0160112 A1 | | 7/2005 | Makela et al. |
| 2005/0248667 A1 | | 11/2005 | Schweng et al. |
| 2005/0285955 A1 | | 12/2005 | Utz et al. |
| 2006/0087572 A1 | | 4/2006 | Schroeder |
| 2006/0108505 A1 | | 5/2006 | Gruhlke et al. |
| 2006/0125936 A1 | | 6/2006 | Gruhlke et al. |
| 2006/0187312 A1 | | 8/2006 | Labaziewicz et al. |
| 2006/0187322 A1 | | 8/2006 | Janson, Jr. et al. |
| 2006/0187338 A1 | | 8/2006 | May et al. |
| 2007/0002159 A1 | | 1/2007 | Olsen et al. |

FOREIGN PATENT DOCUMENTS

| | | |
|---|---|---|
| EP | 1 032 045 | 8/2000 |
| JP | 62-011264 | 1/1987 |

OTHER PUBLICATIONS

Duparre et al., "Ultra-Thin Camera Based on Artificial Apposition Compound Eyes," Proc 10th Microoptics Conference MOC '04, Jena, 2004, Paper E-2 (2 pages).

Duparre et al., "Artificial apposition compound eye fabricated by micro-optics technology," Applied Optics, vol. 43, No. 22, Aug. 2004, pp. 4303-4310.

Duparre et al., "Artificial compound eyes—different concepts and their application to ultra flat image acquisition sensors," Proceeding so SPIE, vol. 5346 (SPIE, Bellingham, WA, 2004), pp. 89-100.

Duparre et al., "Microoptical telescope compound eye," Optics Express, vol. 13, No. 3, Feb. 2005, pp. 889-903.

Kitamura et al., "Reconstruction of a high-resolution image on a compound-eye image-capturing system," Applied Optics, vol. 43, No. 8, Mar. 2004, pp. 1719-1727.

Miki et al., "A Study of Multi-Stack Silicon-Directed Wafer Bonding for MEMS Manufacturing," 2002., IEEE, pp. 407-410.

Miyatake et al., "Thin observation module by bound optics (TOMBO) with color filters," SPEI and IS&T, vol. 5301, 2004, pp. 7-12.

Norvell, Robin, Shellcase Debuts Ultra-Thin Miniaturization for Optics, Jul. 8, 2005, (1 page).

Shogenji et al., "Bimodal fingerprint capturing system based on compound-eye imaging module," Applied Optcs, vol. 43, No. 6, Feb. 2004, pp. 1355-1359.

Shogenji et al., "Multispectral imaging using compact compound optics," Optics Express, vol. 12, No. 8., Apr. 2004, pp. 1643-1655.

Stager et al., "Replicated Micro-Optics for Automotive Applications," SPIE European Workshop on Photonics in the Automobile, Geneva, 2004, (8 pages).

Tanida et al., "Compact image capturing system based on compound imaging and digital reconstruction," Proceedings of SPIE, vol. 4455, 2001, pp. 34-41.

Tanida, "Color imaging with an integrated compound imaging system," Optics Express, vol. 11, No. 18, Sep. 2003, pp. 2109-2117.

Völkel et al., "Miniaturization of Imaging Systems," mstnews, Feb. 2003, pp. 36-38.

Volkel et al., "Miniaturized imaging systems," Elsevier Science B.V., Microelectronic Engineering 67-68 (2003), pp. 461-472.

Wood et al., "Resolution Improvement for Compound Eye Images Through Lens Diversity," IEEE, Signal Processing Society, DSP/SPE Workshop, Aug. 2, 2004 (5 pages).

International Search Report and Written Opinion for PCT/US2005/30256 mailed Jul. 7, 2008.

International Preliminary Report on Patentability for PCT/US2005/030256 issued Mar. 17, 2009.

International Search Report and Written Opinion for PCT/US2006/25781 mailed Jul. 22, 2008.

International Preliminary Report on Patentability for PCT/US2006/025781 issued Mar. 10, 2009.

Office Action for U.S. Appl. No. 11/788,120, mailed May 19, 2009.

Notice of Allowance for U.S. Appl. No. 11/888,546, mailed Jun. 3, 2009.

Office Action for U.S. Appl. No. 11/825,382, mailed Oct. 29, 2009.

Office Action for U.S. Appl. No. 11/478,242, mailed Sep. 16, 2009.

Office Action for U.S. Appl. No. 11/888,582, mailed Sep. 3, 2009.

Office Action for U.S. Appl. No. 11/788,120, mailed Sep. 18, 2009.

First Office Action for Chinese Application 200580032374.0, notification date Feb. 5, 2010.

Notice of Allowance for U.S. Appl. No. 11/478,242, mailed Dec. 30, 2009.

Notice of Allowance for U.S. Appl. No. 11/888,546, mailed Dec. 14, 2009.

Office Action on U.S. Appl. No. 11/810,623 mailed Feb. 4, 2010.

Search Report for EP Application 05793927.4, dated Feb. 26, 2010.

Notice of Allowance of U.S. Appl. No. 11/825,382, mailed May 5, 2010.

Office Action on U.S. Appl. No. 11/788,120, mailed Apr. 16, 2010.
Notice of Allowance on U.S. Appl. No. 11/888,582, mailed Aug. 6, 2010.
Non-Final Office Action on U.S. Appl. No. 11/810,623, mailed Aug. 18, 2010.
Final Office Action on U.S. Appl. No. 11/788,120, mailed Jul. 30, 2010.
Second Office Action on Chinese Application 200580032374.0, issued Sep. 9, 2010.

* cited by examiner

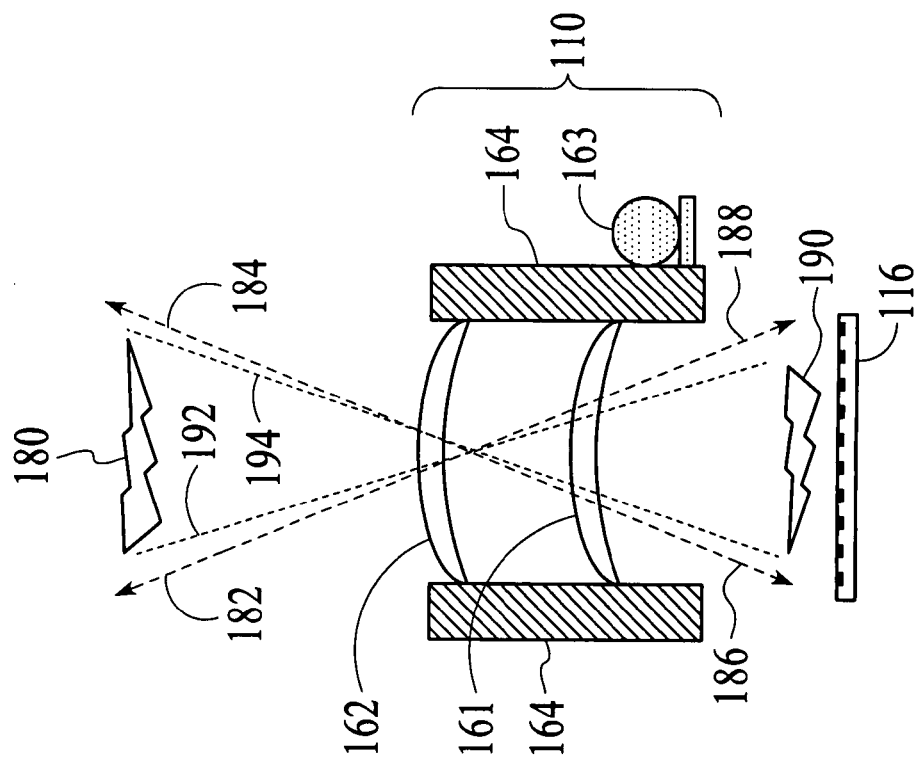
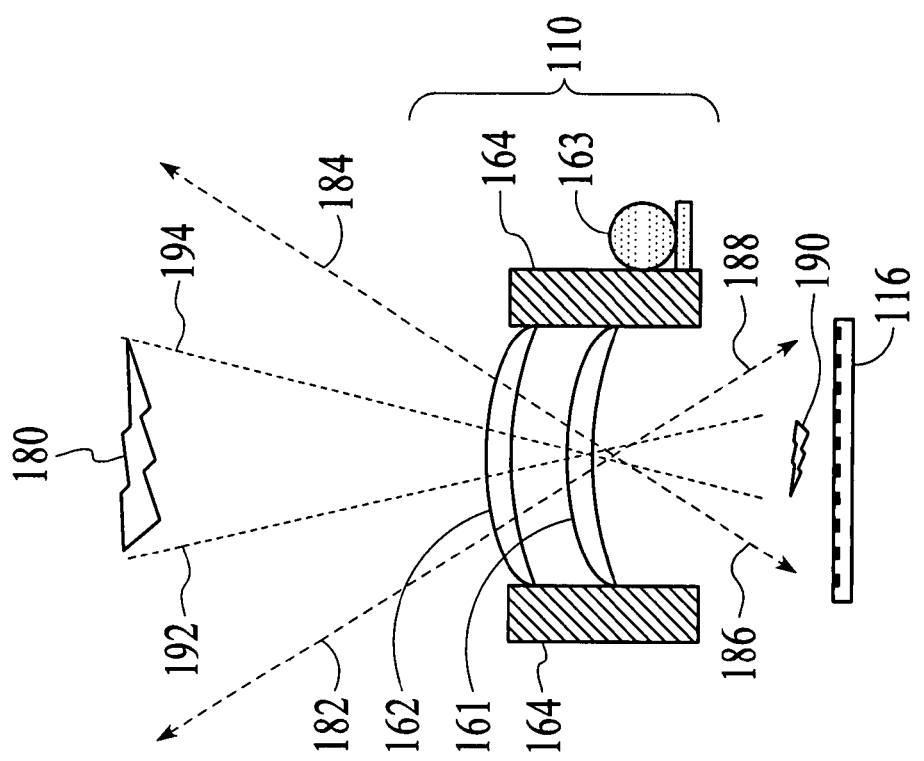

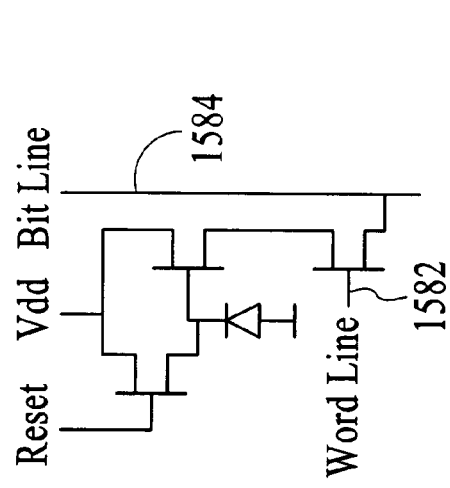
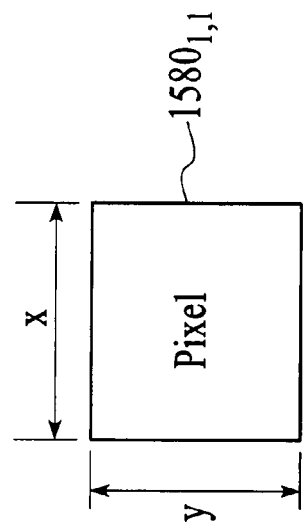
FIG.15C
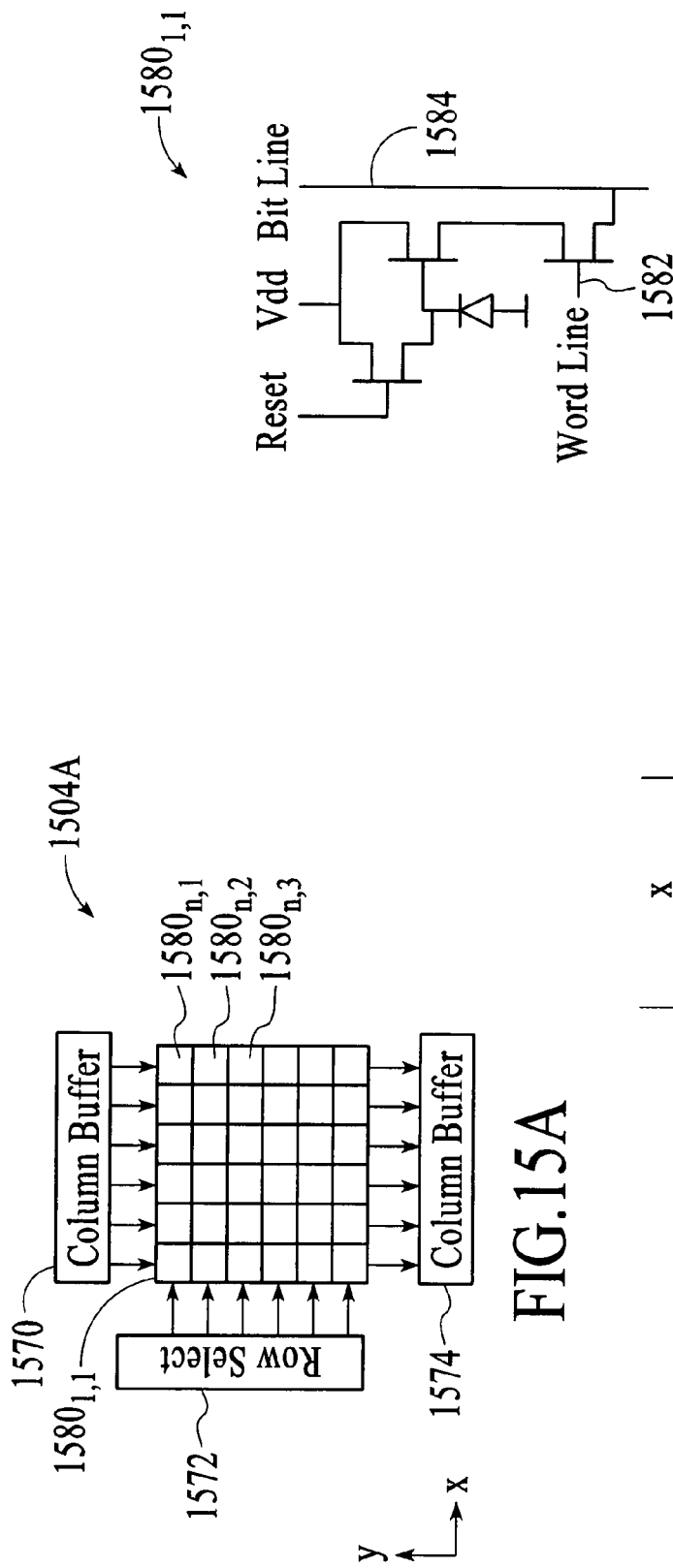
FIG.15B
FIG.15A

SIMULTANEOUS MULTIPLE FIELD OF VIEW DIGITAL CAMERAS

CROSS-REFERENCE TO RELATED APPLICATIONS

This application claims the benefit of U.S. Patent Application No. 60/795,946, filed Apr. 28, 2006. This application is also a continuation in part application of U.S. patent application Ser. No. 11/212,803, filed Aug. 25, 2005. U.S. patent application Ser. No. 11/212,803 claims priority to U.S. Provisional Patent Application No. 60/604,854 filed Aug. 25, 2004 and to U.S. Provisional Patent Application No. 60/695,946 filed Jul. 1, 2005, all of which are entirely incorporated by reference herein.

TECHNICAL FIELD

The following disclosure relates generally to optical devices and more particularly to digital imaging.

BACKGROUND

The recent technology transition from film to electronic media has spurred the rapid growth of the imaging industry. This growth includes new applications in still and video cameras, cell phones, other personal communications devices, surveillance equipment, automotive applications, computers, manufacturing and inspection devices, medical appliances, toys, plus a wide range of other and continuously expanding applications. The lower cost and reduced size of digital cameras, whether as stand-alone products or embedded subsystems, is a primary driver for this growth and market expansion.

Most digital imaging applications are continuously in need of higher performance or better image quality, more and/or better features, smaller size and/or lower cost. These market needs can often be in conflict as, for example, higher performance often requires larger size, improved features can require higher cost as well as a larger size, and conversely, reduced cost and/or size can come at a penalty in performance and/or features. As an example, consumers look for higher quality images from their cell phones, but are unwilling to accept the size or cost associated with putting stand-alone digital camera quality into their pocket sized phones.

One obstacle in the challenge to deliver higher image quality is the lens system of digital cameras. The ability to image with different fields of view (zoom in and out) is a highly desired feature. Zoom, as performed by the lens system, is known as "optical zoom". This desirable "zoom lens" feature adds additional components, size and cost to a lens system. The zoom lens also requires significant power and time to operate. The time to move the optical elements in the zoom lens limits the ability to acquire multiple fields of view in rapid and/or simultaneous fashion.

Digital camera suppliers have one advantage over traditional film providers in the area of zoom capability. Through electronic processing, digital cameras can provide "electronic zoom" which provides the zoom capability by cropping the outer regions of an image and then electronically enlarging the center region to the original size of the image. In a manner similar to traditional enlargements, a degree of resolution is lost when performing this process. Further, since digital cameras capture discrete input to form a picture rather than the ubiquitous process of film, the lost resolution is more pronounced. As such, although "electronic zoom" is a desired feature, it is not a direct substitute for "optical zoom."

Digital photography often requires imaging and subsequent display of different fields of views of the same or nearly the same scene. In some applications it is desirable to capture different fields of view of the same scene at the same time. This is not possible with optical zoom because of the time required to move the optical elements. Electronic zoom can display wide and narrow field of view (FOV) by cropping and enlarging the size of a portion of an image, but the displayed narrow field is often of inferior resolution. Foveal image sensors that use multiple pixels arranged both within and about a central fovea region of the chip can be used to acquire both a wide and narrow field of view. The pixels in the central fovea region have a smaller size than the pixels arranged in peripheral rings about the central region. The foveal image sensor has high resolution only in the narrow field of view. Multiple digital cameras with different fields of view can be integrated into a single camera body and used to acquire images simultaneously; however a system including multiple digital cameras is large and expensive. Consequently, there is a need for a high-performance solid-state digital camera that is capable of simultaneously acquiring imaging having high resolution using multiple fields of view.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

FIG. 2A shows the operation of conventional lens assembly in a retracted mode (also referred to as normal mode or a near focus setting).

FIG. 2B shows the operation of conventional lens assembly in an optical zoom mode (sometimes referred to as a far focus setting).

FIGS. 15A-15C are schematic representations of a sensor array, under an embodiment.

DETAILED DESCRIPTION

Figure 1:
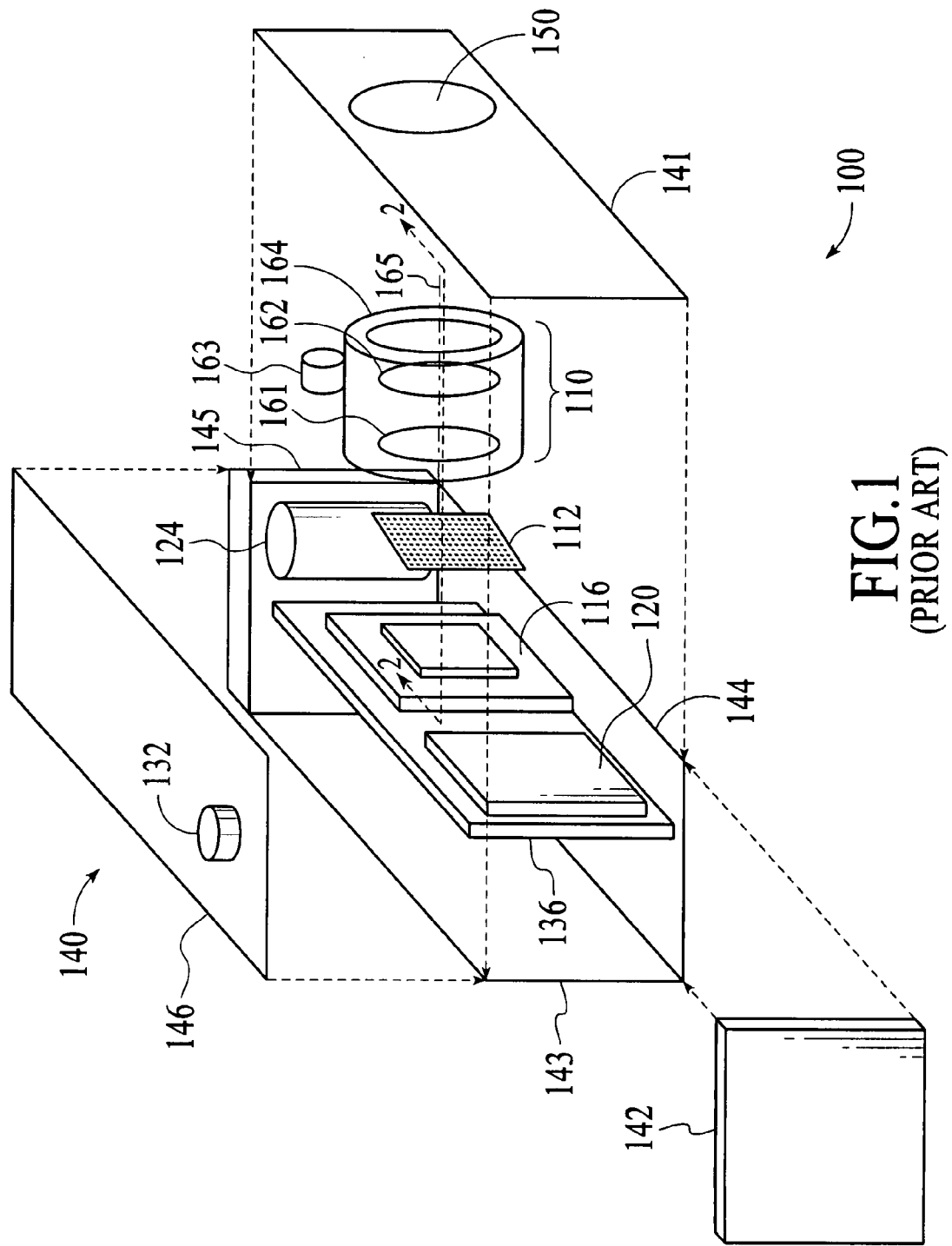
FIG. 1 is a block diagram of a conventional digital camera.

A digital camera system and methods are described below that provide a digital camera in which multiple fields of view (FOV) of an image are simultaneously acquired. The digital camera system includes a digital camera having two or more camera channels each with independent image sensors. The sensor of each camera channel has an active area that includes multiple picture elements (pixels), and image capture includes simultaneous or nearly simultaneous use of the multiple camera channels. Each camera channel and associated optics of that camera channel has a predetermined field of view that can be different from other camera channels of the digital camera system. The digital camera system therefore makes possible the formation of multiple high resolution images in which different fields of view are acquired simultaneously. The digital camera system further includes methods for forming images as described below.

The digital camera system of an embodiment includes a multiple optical system configuration in which a scene is imaged onto multiple image sensors located on the same integrated circuit substrate. Each image sensor operates independently and, when combined with its own optics and electronics, forms a separate camera channel. Each image sensor is located beneath an optical assembly. The optical assembly, including optional mechanical or electromechanical mechanisms, can be processed on the image sensor wafer, applied to the image wafer by a separate wafer transfer, transferred individually by pick and place method, or attached at the die level.

The combination of the focal plane or image sensor size along with the optical focal length associated with each image sensor is chosen to provide a desired field of view. The electrical operation of each camera channel is independent of the other camera channels and multiple fields of view can be acquired simultaneously. The pixel size, array size and image sensor configuration can have approximately the same configuration in each camera channel or be configured so as to be optimized for each field of view. The imager electrical operation can be similar in each camera channel or configured so as to be optimized for each field of view (such as imager frame rate and integration time). The multiple camera channels operate independently, however embodiments provide for sharing of electrical and/or mechanical components in a host digital camera.

The digital camera systems described herein enable visual imaging tasks including search, detection, recognition, and tracking, which may not be easily handled by conventional imaging systems with single optics. For example, the digital camera systems of an embodiment can be used in active vision systems of autonomous or semi-autonomous host systems. These systems range from commercial and industrial applications to surveillance and military applications. The commercial and industrial applications may involve robots, unmanned vehicles, self-navigating cars, automatic assembly and product inspection systems. The surveillance and military applications may involve iris and facial imaging, smart weapons and missile defense systems. The digital camera system of an embodiment improves performance of imaging systems and improves functions of search, detection, recognition and tracking by providing simultaneous high resolution imaging in multiple fields of view with optimum electrical operation (such as independent frame rate and integration time control) in each field of view.

FIG. 1 is a block diagram of a conventional digital camera 100. The digital camera 100 includes a lens assembly 110, a color filter array layer 112, an image sensor 116, and an electronic image storage media 120. The digital camera 100 also includes a power supply 124, a peripheral user interface (represented as a shutter button) 132, a circuit board 136 (which supports and electrically interconnects the aforementioned components), a housing 140 (including housing portions 141, 142, 143, 144, 145 and 146) and a shutter assembly (not shown), which controls an aperture 150 and passage of light into the digital camera 100. A mechanical frame 164 is used to couple or connect the various components or parts of the lens assembly 110. The lens assembly 110 includes lenses 161 and 162 and one or more electromechanical devices 163 to move the lenses 161 and 162 along a center axis 165. The lenses 161 and 162 may comprise multiple elements arranged together to form an integral optical component. Additional lenses may be included. The electromechanical device 163 of the lens assembly 110 and the mechanical frame 164 of the lens assembly 110 can include numerous components and/or complex assemblies.

The optional color filter array layer 112 includes an array of color filters arranged in a Bayer pattern (e.g., a 2×2 matrix of colors with alternating red and green in one row and alternating green and blue in the other row, although other colors may be used). The Bayer pattern (often used in color camera applications) is repeated throughout the color filter array.

The image sensor 116 includes a plurality of identical photo detectors (sometimes referred to as "picture elements" or "pixels") arranged in a matrix. The number of photo detectors is usually in range of hundreds of thousands to millions. The pixel spacing is usually in the range of 2-5 μm for visible light. The lens assembly 110 spans the diagonal of the array.

Each of the color filters in the color filter array 112 is disposed above a respective one of the photo detectors in the image sensor 116, such that each photo detector in the image sensor receives a specific band of visible light (e.g., red, green or blue) and provides a signal indicative of the color intensity of the received visible light. Signal processing circuitry (not shown) receives signals from the photo detectors, processes the received signals, and outputs a color image.

The peripheral user interface 132, which includes the shutter button, may include one or more additional input devices (e.g., for settings, controls and/or input of other information). The user interface 132 can also include one or more output devices (e.g., a display for output of images or other information), and associated electronics.

FIG. 2A shows the operation of conventional lens assembly 110 in a retracted mode (also referred to as normal mode or a near focus setting). The lens assembly 110 is shown focused on a distant object (represented as a lightning bolt) 180. A representation of the image sensor 116 is included for reference purposes. A field of view is defined between reference lines 182 and 184. To achieve this field of view 182 and 184, electro-mechanical devices 163 have positioned lenses 161 and 162 relatively close together. The lens assembly 110 passes the field of view through the lenses 161 and 162 and onto the image sensor 116 as indicated by reference lines 186 and 188. An image of the object (indicated at 190) is presented onto the image sensor 116 in the same ratio as the width of the actual image 180 relative to the actual field of view 182 and 184.

FIG. 2B shows the operation of conventional lens assembly 110 in an optical zoom mode (sometimes referred to as a far focus setting). In this mode, the electro-mechanical devices 163 of the lens assembly 110 re-position the lens 161 and 162 so as to reduce the field of view 182 and 184 over the same image area, thus making the object 180 appear closer (i.e., larger). One benefit of the lens assembly 110 is that the resolution with the lens assembly 110 in zoom mode is typically equal to the resolution with the lens assembly 110 in retracted mode. One drawback, however, is that the lens assembly 110 can be costly and complex. Moreover, providing a lens with zoom capability results in less light sensitivity and thus increases the F-stop of the lens, thereby making the lens less effective in low light conditions. The other disadvantage of optical zoom is that the two fields-of-view must be acquired sequentially. Further, since the lens must be moved forward and backwards with respect to the image sensor, additional time and power are required. This is an undesirable aspect of digital cameras as it creates long delays in capture response time as well as diminished battery capacity.

A narrow field of view can be displayed from a conventional digital camera without the use of optical zoom. Through electronic processing, digital cameras can provide "electronic zoom" which provides the zoom capability by cropping the outer regions of an image and then electronically enlarging the center region to the original size of the image. In a manner similar to traditional enlargements, a degree of resolution is lost when performing this process. Further, since digital cameras capture discrete input to form a picture rather than the ubiquitous process of film, the lost resolution is more pronounced. As such, although "electronic zoom" is a desired feature, it is not a direct substitute for "optical zoom."

Figure 3:
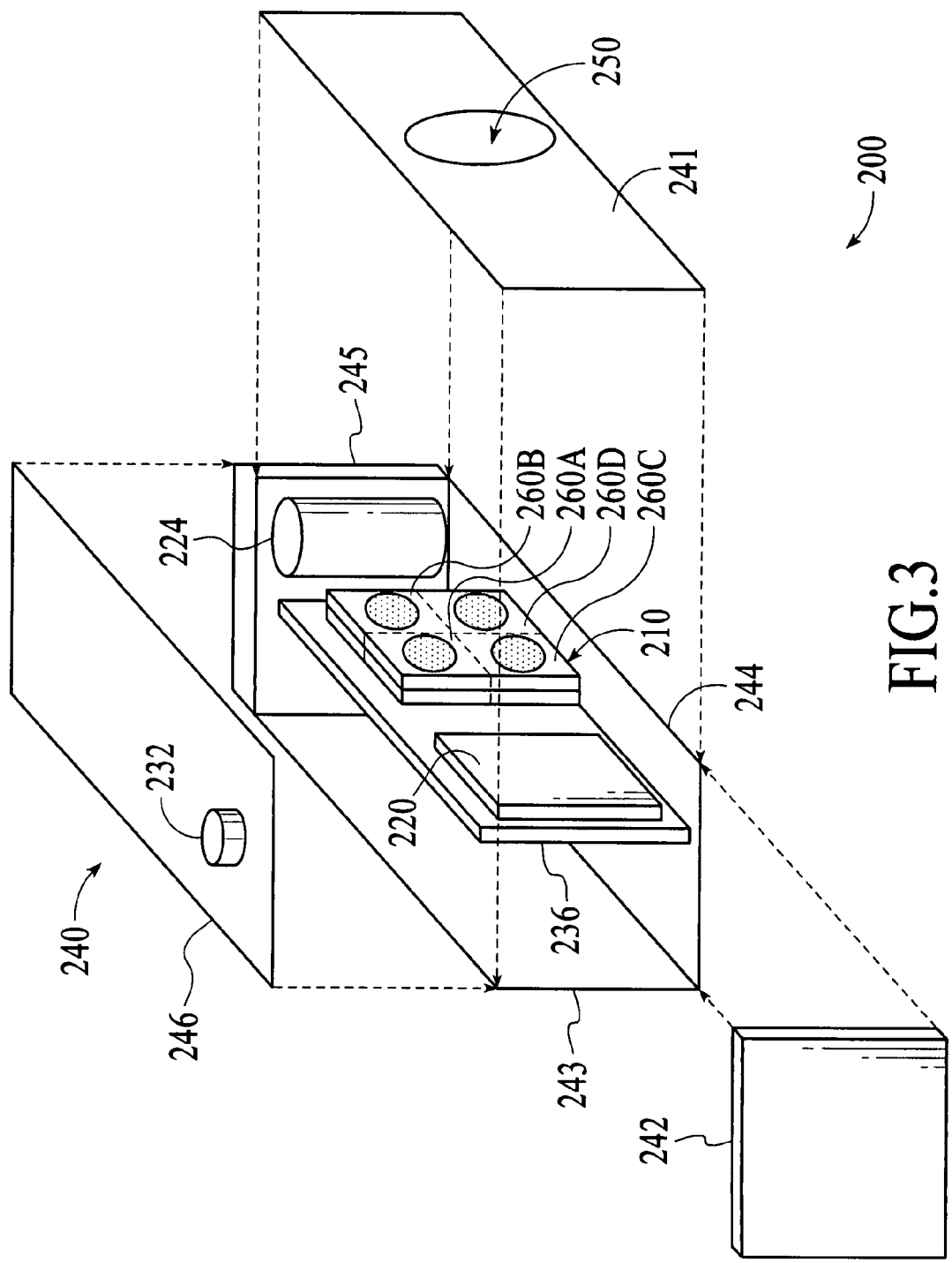
FIG. 3 shows a digital camera configured for simultaneous acquisition of multiple fields of view, under an embodiment.

The digital cameras described herein enable imaging that includes simultaneous acquisition of multiple fields of view of an image. FIG. 3 shows a digital camera 200 configured for simultaneous acquisition of multiple fields of view, under an embodiment. The digital camera 200 includes a digital camera subsystem 210, an electronic image storage media 220, a power supply 224, a peripheral user interface (represented as a shutter button) 232, a circuit board 236 that supports and/or electrically couples or interconnects the components, a housing 240 (including housing portions 241, 242, 243, 244, 245 and 246) and a shutter assembly (not shown), which controls an aperture 250 and passage of light into the digital camera 200. The digital camera subsystem (DCS) 210 includes one or more camera channels (e.g., four camera channels 260A-260D) and replaces and/or fulfills one, some or all of the roles fulfilled by the lens assembly 110, the color filter 112 and the image sensor 116 of the digital camera 100 described above. The four camera channels 260A-260D are configured through pixel array size and/or optical focal length to provide a desired field of view for that channel. The four camera channels 260A-260D can be operated simultaneously with independent electrical control of features such as integration time control and frame rate (in video applications) to name a few.

The peripheral user interface 232, which includes the shutter button, can include one or more additional input devices (e.g., for settings, controls and/or input of other information). The peripheral user interface 232 can also include one or more output devices, (e.g., a display for output of images or other information) and associated electronics. The electronic image storage media 220, power supply 224, peripheral user interface 232, circuit board 236, housing 240, shutter assembly (not shown), and aperture 250, may be, for example, similar to the electronic image storage media 120, power supply 124, peripheral user interface 132, circuit board 136, housing 140, shutter assembly (not shown), and aperture 150 of the digital camera 100 described above.

Figure 4:
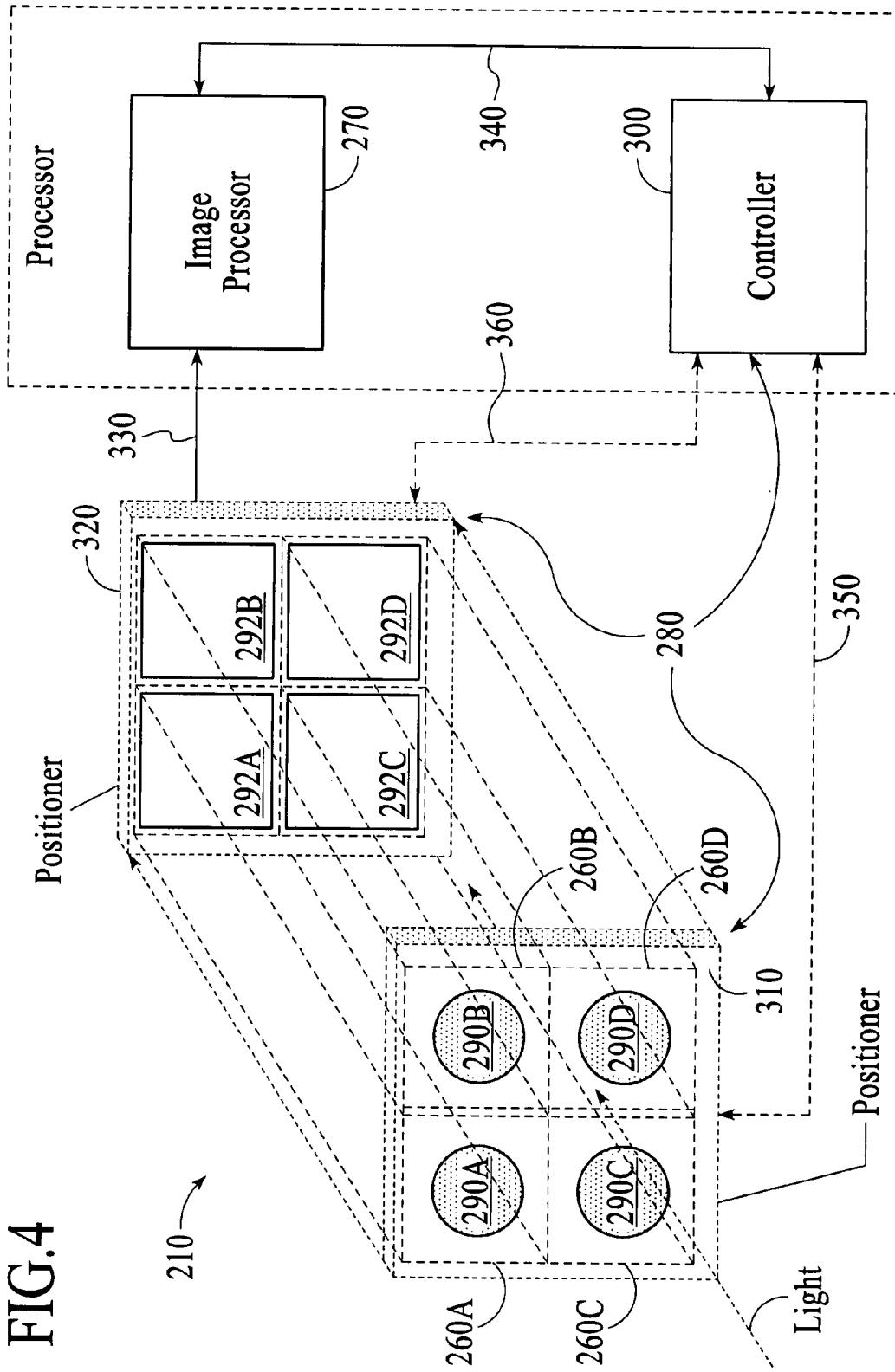
FIG. 4 is a digital camera system that includes multiple camera channels, under an embodiment.

FIG. 4 is a digital camera system 210 that includes multiple camera channels, under an embodiment. The digital camera system 210 of this example includes four camera channels 260A-260D but is not limited to four camera channels; alternative embodiments can have any number of camera channels. Each of the camera channels 260A-260D includes an optics component or portion and a sensor component or portion. For example, camera channel 260A includes an optics portion 290A and a sensor portion 292A. Camera channel B includes an optics portion 290B and a sensor portion 292B. Camera channel C includes an optics portion 290C and a sensor portion 292C. Camera channel D includes an optics portion 290D and a sensor portion 292D. The optics portions of the one or more camera channels are collectively referred to herein as an optics subsystem. The sensor portions of the one or more camera channels are collectively referred to herein as a sensor subsystem.

Each camera channel of the digital camera subsystem 210 of an embodiment provides a different FOV imaging capability relative to at least one other camera channel. For example, in one embodiment, one camera channel (e.g. camera channel 260A) detects a wide field of view (e.g. 40°×30°), one camera channel (e.g., camera channel 260B) detects a medium field of view (e.g. 20°×15°), one camera channel (e.g., camera channel 260C) detects a narrow field of view (e.g. 12°×9°), and one camera channel (e.g., camera channel 260D) detects light in a very narrow field on view (e.g. 5°×5°).

The digital camera subsystems of one or more alternative embodiments may configure one or more of the camera channels to have different fields of view than those described above. For example, one camera channel (e.g. camera channel 260A) detects a wide field of view (e.g. 50°×40°), one camera channel (e.g., camera channel 260B) detects a medium field of view (e.g. 30°×15°), one camera channel (e.g., camera channel 260C) detects a narrow field of view (e.g. 12°×9°), and one camera channel (e.g., camera channel 260D) detects light in a very narrow field on view (e.g. 5°×5°).

Other alternative embodiments of the digital camera subsystems configure one or more of the camera channels to have a similar field of view relative to at least one other camera channel and a different field of view relative to at least one other camera channel. For example, in one alternative embodiment, one camera channel (e.g. camera channel 260A) detects a wide field of view (e.g. 40°×30°), two camera channels (e.g., camera channel 260B and 260C) detect a medium field of view (e.g. 20°×15°), and one camera channel (e.g., camera channel 260D) detects a narrow field of view (e.g. 12°×9°).

In digital photography, the FOV (also referred to as angle of view) describes the angular extent of a given scene that is imaged by a camera. The FOV of a camera is a function of parameters that include the focal length of the photographic lens projecting the image and the dimensions of the image sensor. Therefore, the digital cameras of an embodiment can provide a different FOV in each channel by controlling or varying parameters of the focal length of the photographic lens in combination with parameters of the image sensor. For example, the sensor dimensions can be approximately the same for the sensors of all channels of the camera while the focal length of the optics component varies among the channels. As another example, the focal length of the optics components can be approximately the same in all channels while the sensor dimensions vary among the channels. In yet another embodiment, the focal length of the optics component and the sensor dimensions both vary among the channels.

In the digital camera subsystem 210, the optics portion of each camera channel can be configured similar to and/or different from the optics portion of at least one other camera channel. For example, embodiments of the digital camera subsystem 210 include optics portions that are configured approximately the same while having a different sensor array size (area) between camera channels to provide a different FOV capability. The sensor array area change can be accomplished by changing the number of pixels and/or pixel size of the array. In addition to array area differences between the channels, parameters of the image sensor electrical operation (e.g., integration time, frame rate, etc.) can be configured differently in order to optimize system camera performance in the field of view of one or more specific camera channels.

In other embodiments of the digital camera subsystem 210, the optics portion of one or more camera channels is configured differently, in one or more respects (e.g., focal length, f-number, etc.), from the optics portion of one or more other camera channels. For example, in some embodiments, at least one characteristic (e.g., type of element(s), size, performance, etc.) of one or more of the optics portions is configured to the respective sensor portion and/or to achieve a desired result. For example, if a particular camera channel is dedicated to a particular color (or band of colors) or wavelength (or band of wavelengths) then the optics portion for that camera channel may be configured to transmit only that particular color (or band of colors) or wavelength (or band of wavelengths) to the sensor portion of the particular camera channel. Similarly, if a particular camera channel is dedicated to a particular color (or band of colors) or wavelength (or band of wavelengths) then the optics portion for that camera channel may be configured to filter out one or more other colors or wavelengths.

Likewise, the sensor portion of each camera channel of the digital camera subsystem 210 can be configured similar to and/or different from the sensor portion of at least one other camera channel. In some embodiments, the sensor portions of each camera channel are similarly configured. In some other embodiments, a configuration of one or more of sensor portions is different, in one or more respects, from one or more of the other sensor portions. For example, in some embodiments, one or more of the characteristics (e.g., type of element(s), size, performance, etc.) of one or more of the sensor portions is configured to the respective optics portion and/or to help achieve a desired result. For example, if a particular camera channel is dedicated to a particular color (or band of colors) or wavelength (or band of wavelengths) then the sensor portion for that camera channel may be configured to have a sensitivity that is higher to that particular color (or band of colors) or wavelength (or band of wavelengths) than other colors or wavelengths and/or to sense only that particular color (or band of colors) or wavelength (or band of wavelengths). Similarly, if a particular camera channel is dedicated to a particular color (or band of colors) or wavelength (or band of wavelengths) then the sensor portion for other camera channels may be configured to have a relatively low sensitivity to that particular color (or band of colors) or wavelength (or band of wavelengths) and/or to not detect that particular color (or band of colors) or wavelength (or band of wavelengths).

The digital camera system 210 of an embodiment includes a processor. The processor includes an image processor component or circuitry (referred to herein as image processor 270) and a controller component or circuitry (referred to herein as controller 300). The controller 300 is part of a positioning system 280. The processor 270 is coupled or connected to the one or more sensor portions (e.g. sensor portions 292A-292D) via one or more communication links, represented by a signal line 330.

The positioning system 280 includes the controller 300 and one or more positioners (e.g., positioners 310 and 320). The controller 300 is coupled or connected to the image processor 270 via one or more communication links 340. The controller 300 is coupled or connected to one or more of the positioners (e.g., positioners 310 and 320) via one or more communication links (e.g. some number of electrical signal lines) 350 and 360.

The positioners (e.g., positioners 310 and 320) are adapted to support and/or position each of the one or more optics portions (e.g., optics portions 290A-290D) of a camera channel above and/or in registration with the sensor portions (e.g., sensor portions 292A-292D0 of the respective camera channels. In an example embodiment the positioner 310 supports and positions the one or more optics portions (e.g. optics portions 290A-290D) at least in part. The positioner 320 supports and positions the one or more sensor portions (e.g. sensor portions 292A-292D) at least in part. One or more of the positioners 310 and 320 can also be configured to provide or help provide relative movement between one or more of the respective optics portions 290A-290D and one or more of the respective sensor portions 292A-292D. Aspects of the positioning system 280 are described in detail in U.S. patent application Ser. No. 11/478,242, filed Jun. 29, 2006, which application claims the benefit of U.S. Patent Application No. 60/695,946, filed Jul. 1, 2005, both of which are herein incorporated by reference.

During operations involving the digital camera subsystem 210, an optics portion of a first camera channel receives light from within a first field of view and transmits one or more portions of the received light to the corresponding sensor portion. The sensor portion of the first camera channel receives one or more portions of the light transmitted by the optics portion and outputs a signal representative of the received light. The output signal from the sensor portion is coupled to the image processor, which can generate an image or data based at least in part on information of the output signal.

An optics portion of a second camera channel receives light from within a second field of view and transmits one or more portions of the received light to the corresponding sensor portion. The sensor portion of the second camera channel receives one or more portions of the light transmitted by the optics portion and outputs a signal representative of the received light. The output signal from the sensor portion is coupled to the image processor, which can generate an image or data based at least in part on information of the output signal. The operations of the second camera channel are simultaneous or nearly simultaneous with the operations of the first camera channel. Operations of any additional camera channels are similar to operations of the first and/or second camera channels described above.

The image processor is configured to generate or composite an image based on data from one or more of the camera channels. The image processor of an embodiment is configured to generate a combined image or data based at least in part on the images from the first and second camera channels (and additional camera channels when present), or to independently output camera channel data of each camera channel. The positioning system can control movement of the optics portion (or portions thereof) and/or the sensor portion (or portions thereof) of each camera channel to provide relative positioning with respect to one or operating modes of the digital camera system.

Figure 5:
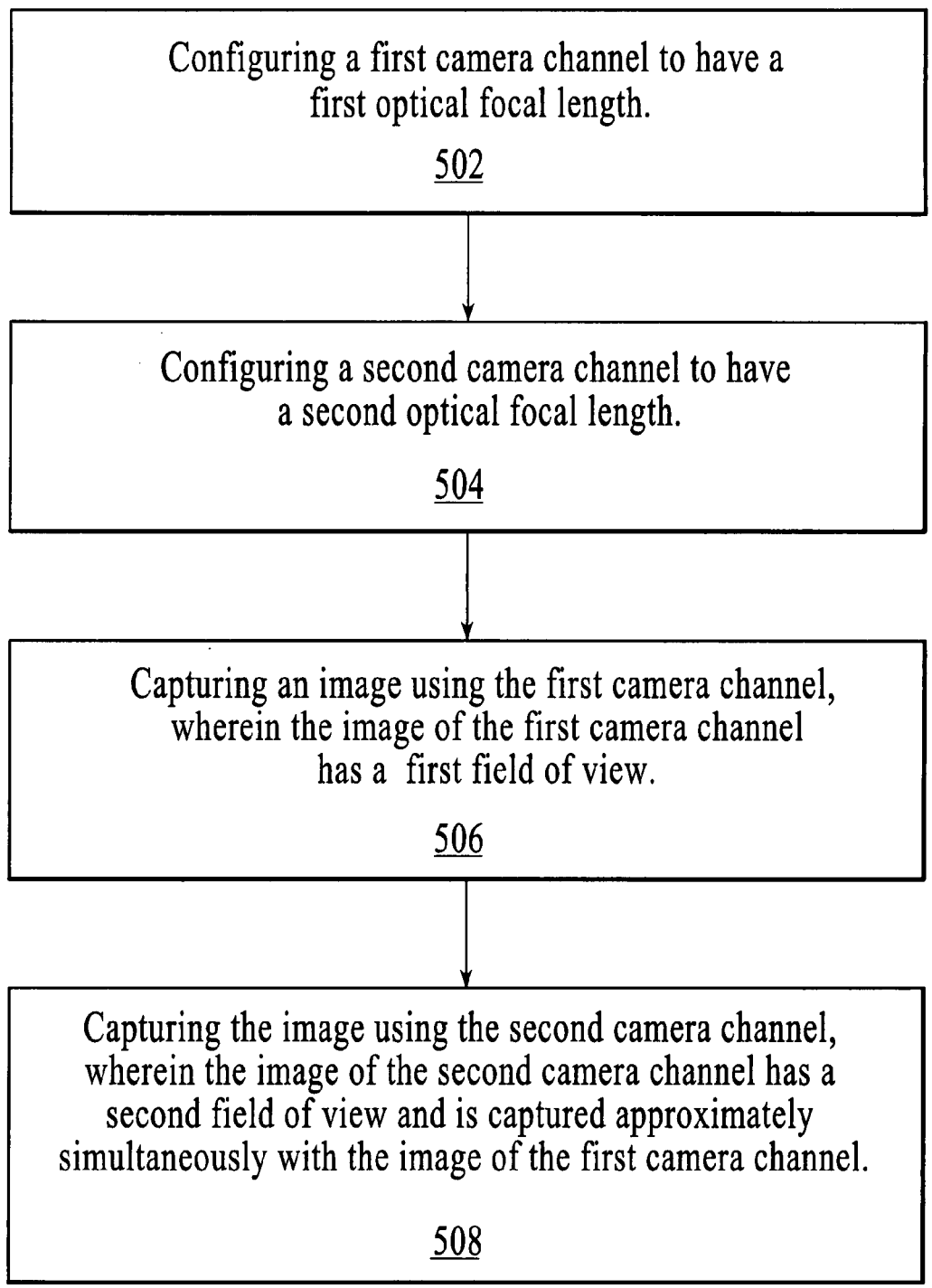
FIG. 5 is a flow diagram for simultaneous acquisition of multiple fields of view, under an embodiment.

FIG. 5 is a flow diagram for simultaneous acquisition of multiple fields of view 500, under an embodiment. The simultaneous acquisition of images having multiple fields of view 500 includes configuring 502 a first camera channel to have a first optical focal length. The acquisition 500 includes configuring 504 a second camera channel to have a second optical focal length that is different from the first optical focal length. An image is captured 506 by the first camera channel, and the image of the first camera channel has a first field of view. Approximately simultaneous with the image capture 506 by the first camera channel, the image is captured 508 by the second camera channel. The image captured by the second camera channel has a second field of view that is different from the first field of view. Optionally, additional camera channels capture the image with the first field of view, the second field of view, or a field of view different from the first and second field of view.

Figure 6:
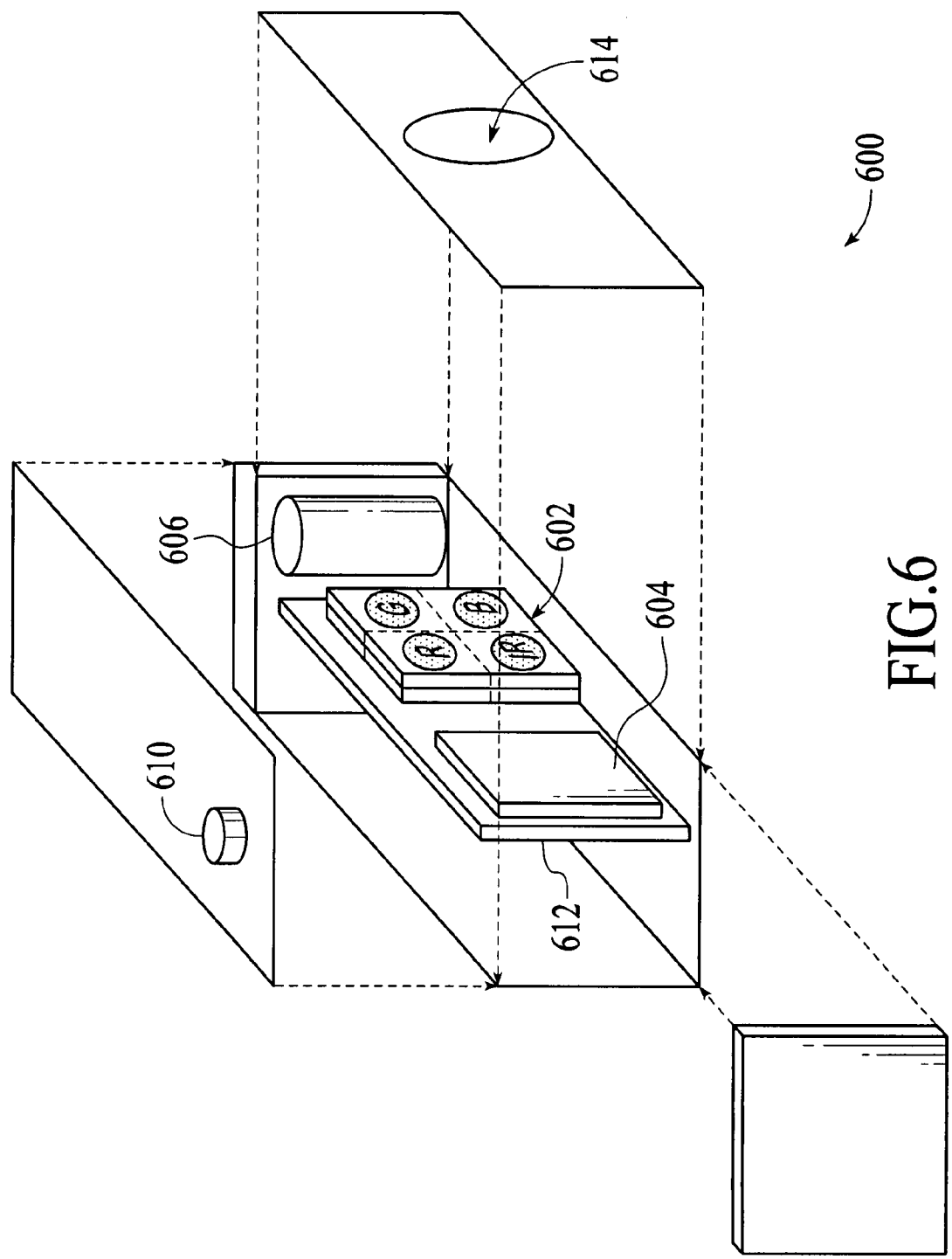
FIG. 6 is a block diagram of a digital camera, under an embodiment.

FIGS. 6-19 illustrate further examples of apparatus and systems in which the imaging module and focusing method embodiments disclosed above can be implemented. FIG. 6 is a block diagram of a digital camera 600, under an embodiment. The digital camera includes a digital camera subsystem 602, a circuit board 612, a peripheral user interface electronics 610 (here represented as a shutter button, but could also include display and/or one or more other output devices, setting controls and/or one or more additional input devices etc), a power supply 606, and electronic image storage media 604. The digital camera 600 may further include a housing and a shutter assembly (not shown), which controls an aperture 614 and passage of light into the digital camera 600.

Figure 7:
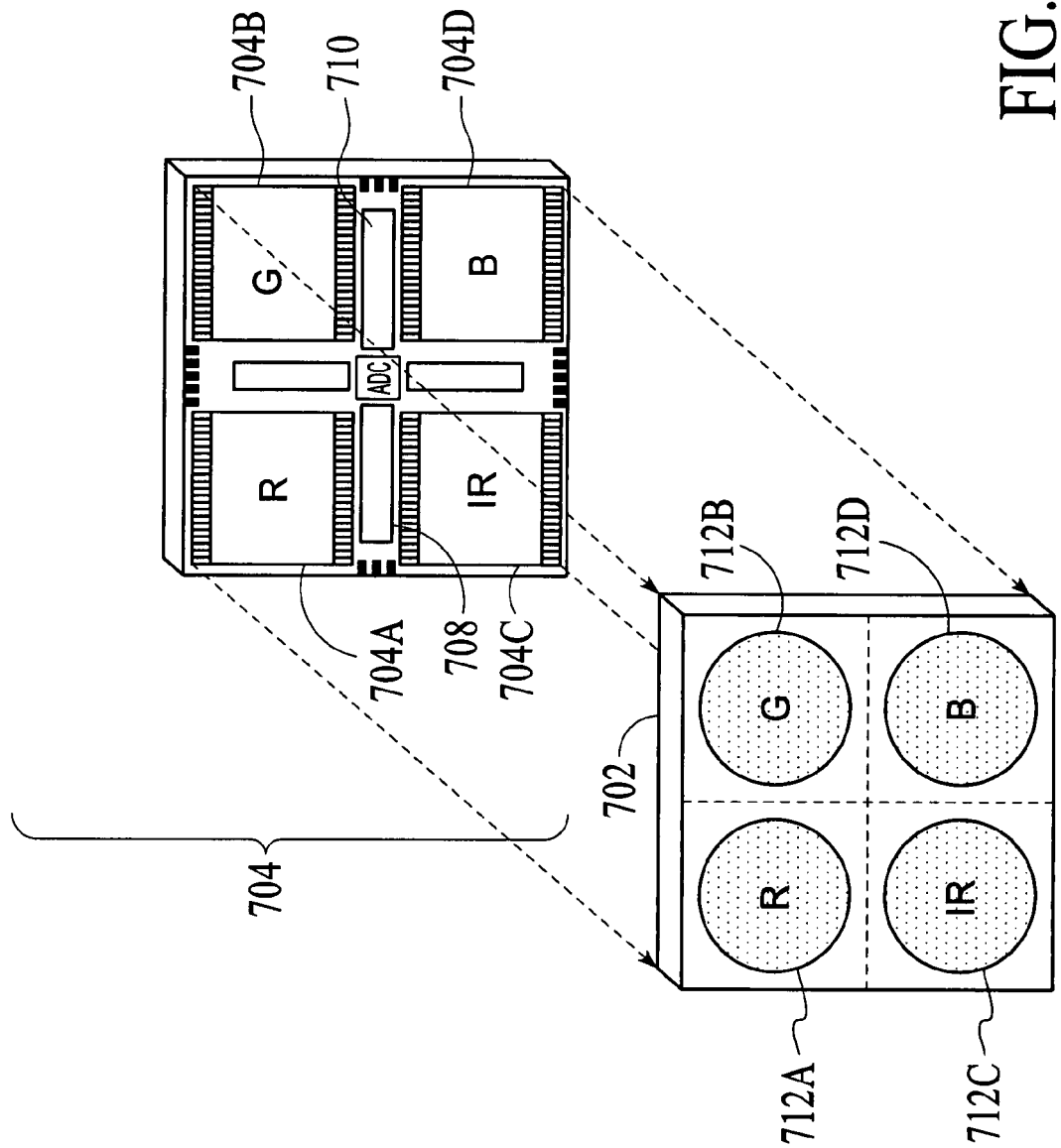
FIG. 7 is an exploded view of a digital camera subsystem, under an embodiment.

FIG. 7 is an exploded view of the digital camera subsystem 602, under an embodiment. In this embodiment, the digital camera subsystem includes an image sensor 704, an optics frame (also referred to as a frame) 702, and lenses 712A-712D. The frame 702 is used to mount the lenses 712A-712D to the image sensor 704. The image sensor, or imager die 704 generally includes a semiconductor integrated circuit or "chip" having several higher order features including multiple arrays 704A-704D and signal processing circuits 708 and 710. Each of the arrays 704A-704D captures photons and outputs electronic signals. The signal processing circuit 708, in certain embodiments, processes signals for each of the individual arrays 704. The signal processing circuit 710 may combine the output from signal processing 708 into output data (usually in the form of a recombined full color image). Each array and the related signal processing circuitry may be tailored to address a specific band of visible spectrum.

Each of lenses 712A-712D may be tailored for the respective wavelength of the respective array. Lenses are approximately the same size as the underlying array 704, and will differ from one another in size and shape depending upon the dimensions of the underlying array. In alternative embodiments a lens could cover only a portion of an array, and could extend beyond the array. Lenses can comprise any suitable material or materials, including for example, glass and plastic. Lenses can be doped in any suitable manner, such as to impart a color filtering, polarization, or other property. Lenses can be rigid or flexible.

In the example of FIG. 7, each lens, array, and signal processing circuit constitutes an image generating subsystem for a band of visible spectrum (e.g., red, blue, green, etc). These individual images are then combined with additional signal processing circuitry within the semiconductor chip to form a full image for output.

Figure 8:
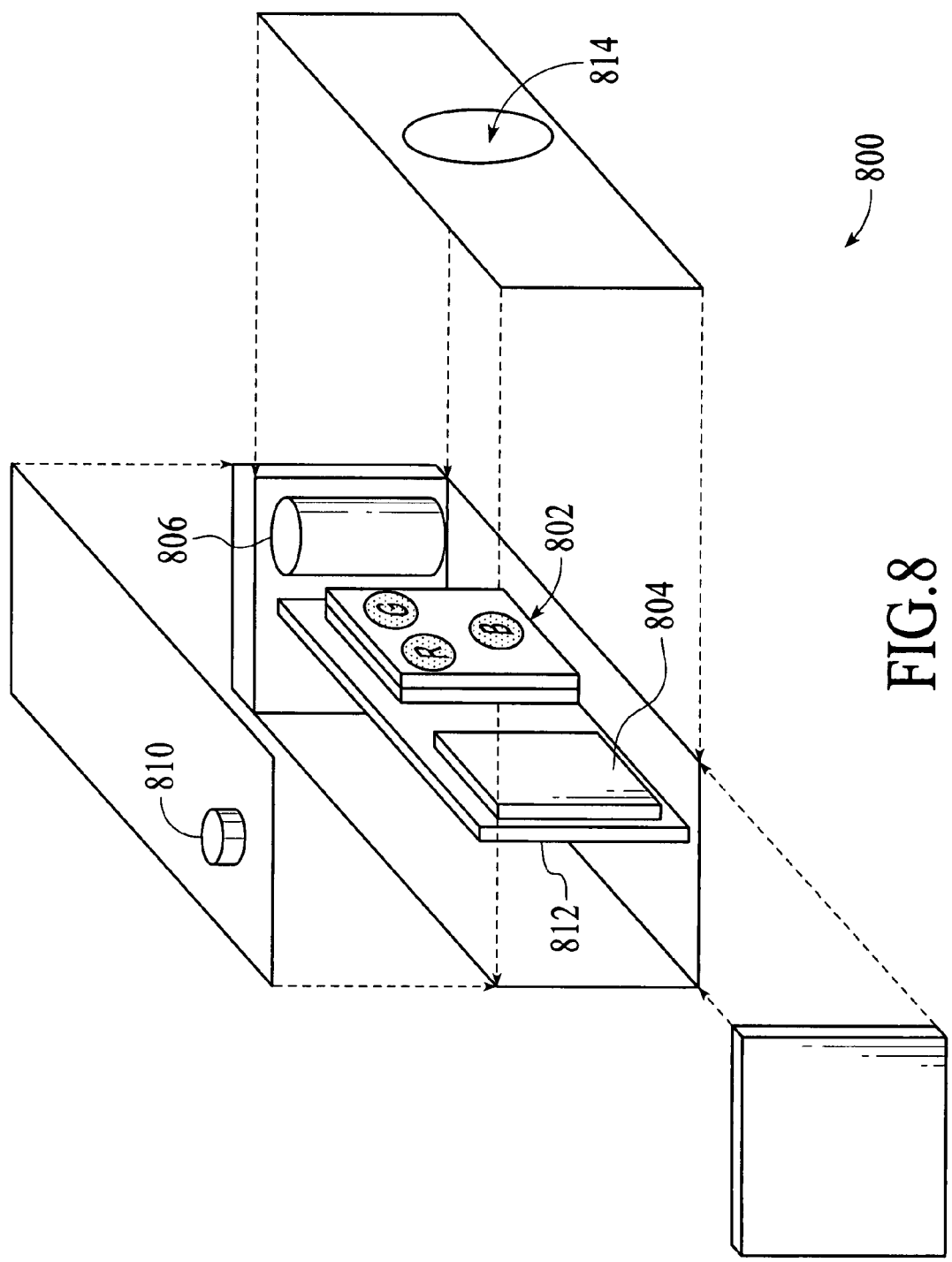
FIG. 8 is a block diagram of a digital camera having a three array/lens configuration, under an embodiment.

Although the digital camera subsystem 704 is depicted in a four array/lens configuration, the digital camera subsystem can be employed in a configuration having any number of arrays/lenses and any combination of shapes of arrays/lenses. FIG. 8 is a block diagram of a digital camera 800 having a three array/lens configuration, under an embodiment. The digital camera 800 includes a digital camera subsystem 802 that includes three lenses. The digital camera 800 further includes a circuit board 812, a peripheral user interface electronics 810 (here represented as a shutter button, but could also include display and/or one or more other output devices, setting controls and/or one or more additional input devices etc), a power supply 806, and electronic image storage media 804. The digital camera 800 may further include a housing and a shutter assembly (not shown), which controls an aperture 814 and passage of light into the digital camera 800.

Figure 9:
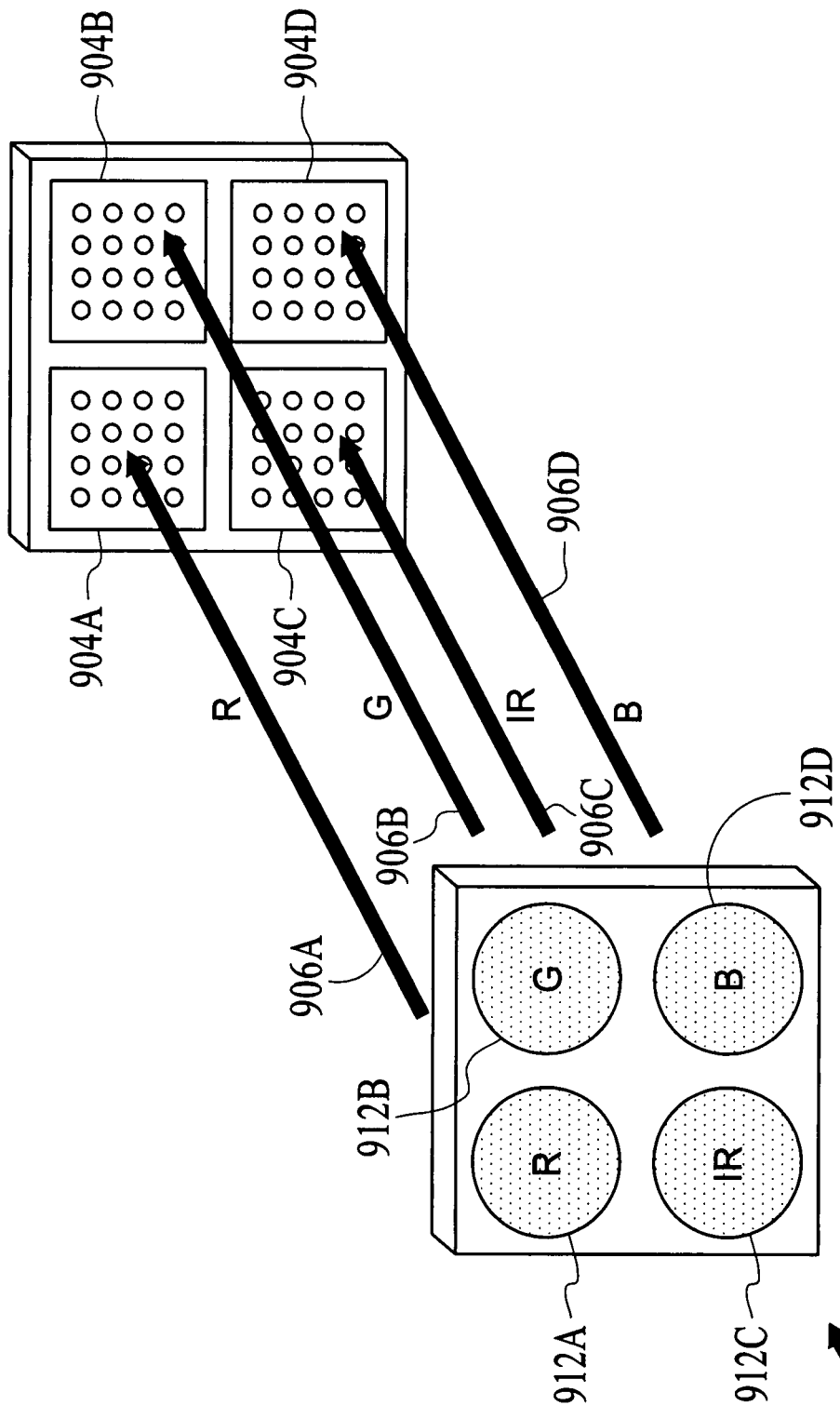
FIG. 9 is a block diagram of a digital camera subsystem that employs separate arrays on one image sensor, under an embodiment.

FIG. 9 is a block diagram of a digital camera subsystem that employs separate arrays, e.g., arrays 904A-904D, on one image sensor, in contrast to the prior art. For example, typical prior art approaches employ a Bayer pattern (or variations thereof), perform operations across the array (a pixel at a time), and integrate each set of four pixels (for example, red/green/blue/green or variation thereof) from the array into a single full color pixel.

Each of the arrays 904 focuses on a specific band of visible spectrum. Each lens only needs to pass a respective color (906A-906D) on to the image sensor. The traditional color filter sheet is eliminated. Each array 904 outputs signals to signal processing circuitry. Signal processing circuitry for each of these arrays is also tailored for each of the bands of visible spectrum. In effect, individual images are created for each of these arrays. Following this process, the individual images are combined or to form one full color or black/white image. By tailoring each array and the associated signal processing circuitry, a higher quality image can be generated than the image resulting from traditional image sensors of like pixel count.

As such, each array may be tuned to be more efficient in capturing and processing the image in that particular color. Individual lenses (912A-D) can be tailored for the array's band of spectrum.

Figure 10:
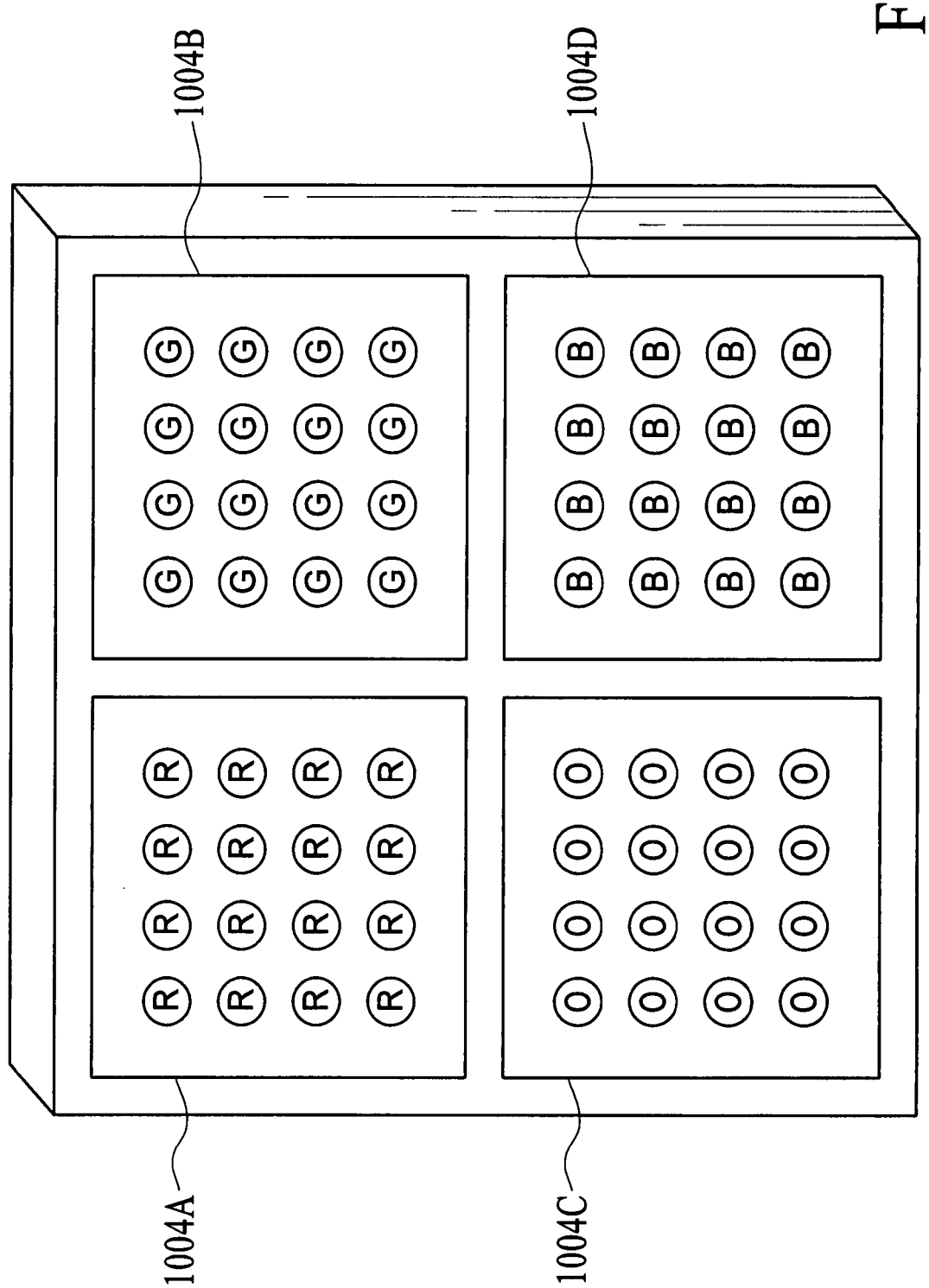
FIG. 10 is a block diagram of arrays, each of which receives a respective color as passed by a respective lens, under an embodiment.

FIG. 10 is a block diagram of arrays 1004A-1004D. Each array 1004 receives a respective color as passed by a respective lens. The traditional color filter sheet is eliminated. Each array 1004 outputs signals to signal processing circuitry. Signal processing circuitry for each of these arrays is also tailored for each of the bands of visible spectrum. In effect, individual images are created for each of these arrays. Following this process, the individual images are combined or to form one full color or black/white image. By tailoring each array and the associated signal processing circuitry, a higher quality image can be generated than the image resulting from traditional image sensors of like pixel count.

Figure 11:
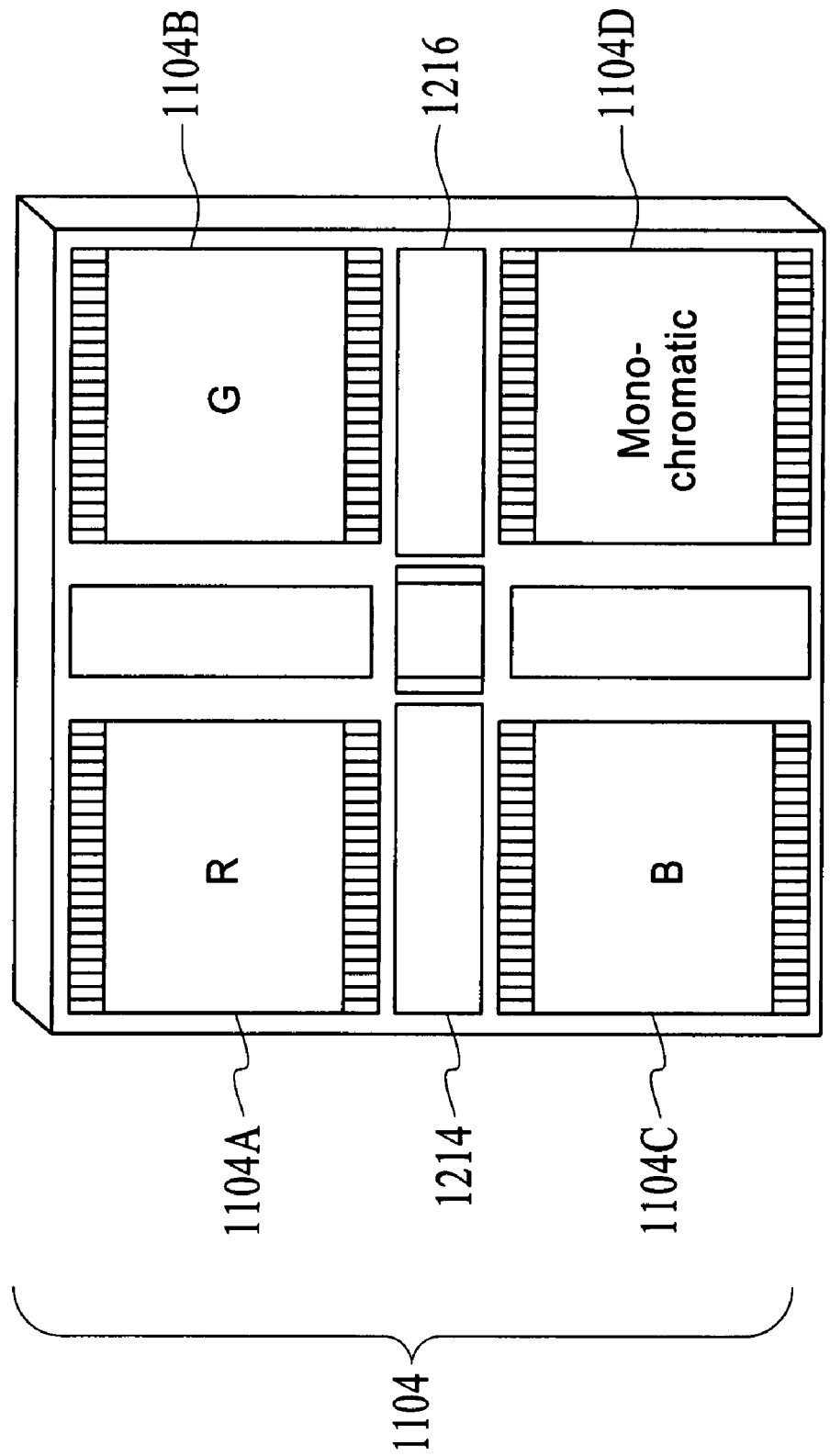
FIG. 11 is a block diagram of processing circuitry of a digital camera subsystem, under an embodiment.

FIG. 11 is a block diagram of processing circuitry of a digital camera subsystem, under an embodiment. FIG. 11 includes an array 1104, including arrays 1104A-1104D, and signal processing circuitry (also referred to as image processing circuitry) 1214 and 1216. Each array outputs signals to signal processing circuitry.

Figure 12:
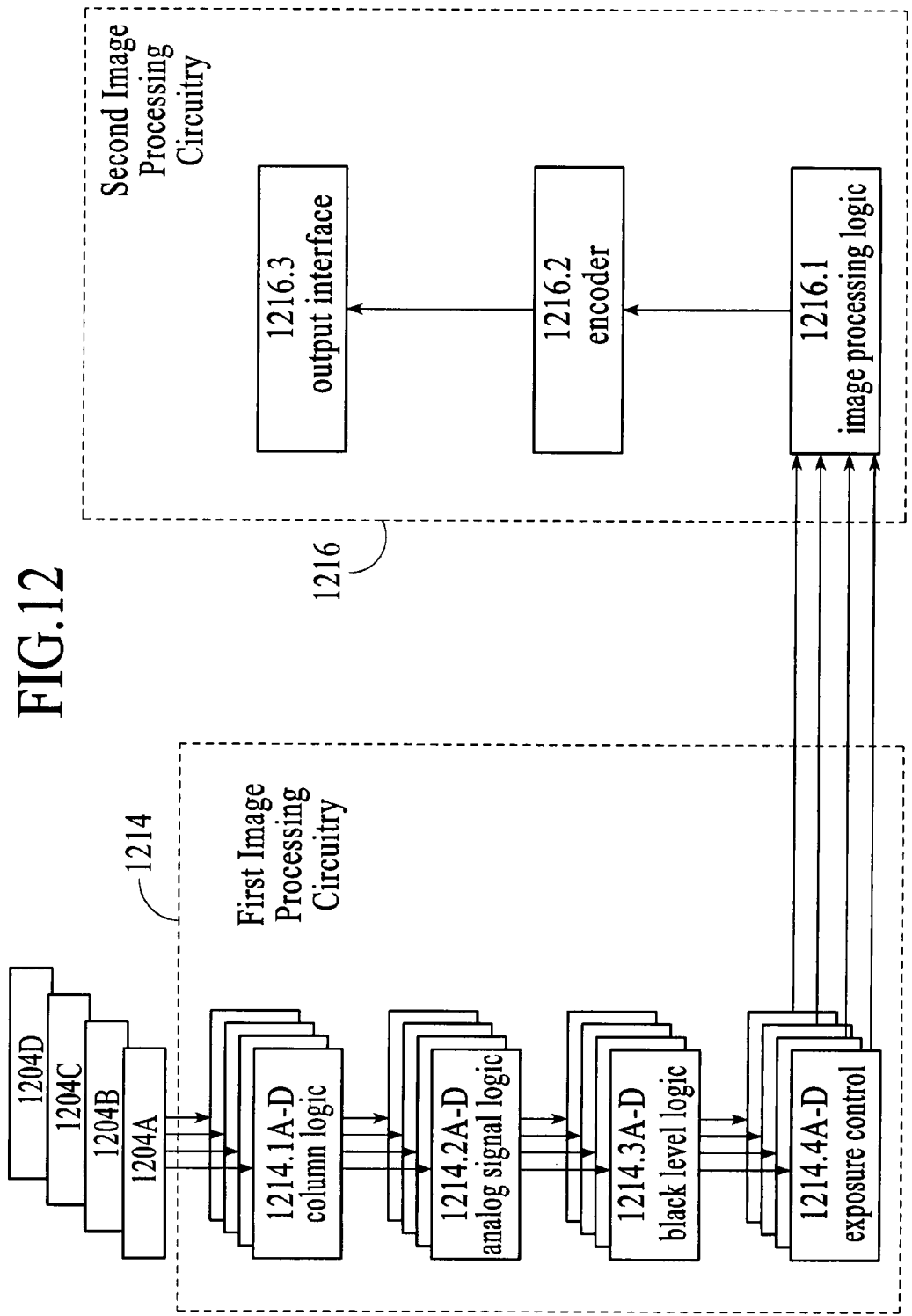
FIG. 12 is a block diagram of signal processing circuitry, under an embodiment.

FIG. 12 is a block diagram of image processing circuitry 1214 and 1216. Within the image processing circuitry 1214, each array can be processed separately to tailor the processing to the respective bands of spectrum.

Column logic 1214.1A-1214.1D is the portion of the signal processing circuitry that reads the signals from the pixels. For example, the column logic 1214.1A reads signals from the pixels in array 1204A. Column logic 1214.1B reads signals from the pixels in array 1204B. Column logic 1214.1C reads signals from the pixels in array 1204C. Column logic 1214.1D reads signals from the pixels in array 1204D.

Since an array is targeting a specific wavelength, wavelengths, band of wavelength, or band of wavelengths, the column logic may have different integration times for each array enhancing dynamic range and/or color specificity. Signal processing circuitry complexity for each array can be substantially reduced since logic may not have to switch between extreme color shifts.

Analog Signal Logic (ASL) 1214.2A-1214.2D for each array may be color specific. As such, the ASL processes a single color and therefore can be optimized for gain, noise, dynamic range, linearity, etc. Due to color signal separation, dramatic shifts in the logic and settling time are not required as the amplifiers and logic do not change on a pixel by pixel (color to color) basis as in traditional Bayer patterned designs.

Black level control 1214.3A-1214.3D assesses the level of noise within the signal, and filters it out. With each array focused upon a narrower band of visible spectrum than traditional image sensors, the black level control can be more finely tuned to eliminate noise.

Exposure control 1214.4A-1214.4D measures the overall volume of light being captured by the array and adjusts the capture time for image quality. Traditional cameras must make this determination on a global basis (for all colors). The embodiments describe herein allow for exposure control to occur differently for each array and targeted band of wavelengths.

These processed images are then passed to a second group of signal processing circuitry 1216. First, image processing logic 1216.1 integrates the multiple color planes into a single color image. The image is adjusted for saturation, sharpness, intensity, hue, artifact removal, and defective pixel correction.

In an embodiment, the final two operations include encoding the signal into standard protocols such as MPEG, JPEG, etc. in an encoder 1216.2 before passing the result to a standard output interface 1216.3, such as USB.

Although the signal processing circuitries 1214 and 1216 are shown at specific areas of the image sensor, the signal processing circuitries 1214 and 1216 can be placed anywhere on the chip and subdivided in any fashion. The signal processing circuitries are often placed in multiple locations.

As previously stated, the image sensor 1204 generally includes a semiconductor chip having several higher order features including multiple arrays (1204A-1204D), and signal processing circuitry 1214, in which each array and the related signal processing circuitry is preferably tailored to address a specific band of visible spectrum. As noted above, the image sensor array can be configured using any multiple numbers and shapes of arrays.

The image sensor 1204 can be constructed using any suitable technology, including silicon and germanium technologies. The pixels can be formed in any suitable manner, can be sized and dimensioned as desired, and can be distributed in any desired pattern. Pixels that are distributed without any regular pattern may also be used.

Any range of visible spectrum can be applied to each array depending on the specific interest of the customer. Further, an infrared array could also be employed as one of the array/lens combinations giving low light capabilities to the sensor.

As previously described, arrays 1204A-1204D may be of any size or shape. While some figures referenced herein show the arrays as individual, discrete sections of the image sensor, these arrays may also be touching. There may also be one large array configured such that the array is subdivided into sections, and each section is focused upon one band of spectrum, creating the same effect as separate arrays on the same chip.

Although the well depth of the photo detectors across each individual array 1204 may be the same, the well depth of any given array may be different from that of other arrays of the sensor subsystem. A photo detector includes an area or portion of the photo detector that captures, collects, is responsive to, detects and/or senses the intensity illumination of incident light. In some embodiments, the well depth is the distance from the surface of the photo detector to a doped region.

Selection of an appropriate well depth depends on many factors, including the targeted band of visible spectrum. Since each entire array is likely to be targeted at one band of visible spectrum (e.g., red) the well depth can be configured to capture that wavelength and ignore others (e.g., blue, green). Doping of the semiconductor material in the color specific arrays can further be used to enhance the selectivity of the photon absorption for color-specific wavelengths.

In various embodiments, a digital camera subsystem can have multiple separate arrays on a single image sensor, each with its own lens. The simple geometry of smaller, multiple arrays allows for a smaller lenses (e.g., smaller diameter, thickness and focal length), which allows for reduced stack height in the digital camera.

The lens and frame concept is applicable to traditional image sensors (without the traditional color filter sheet) to gain physical size, cost and performance advantages.

Each array can advantageously be focused on one band of visible and/or detectable spectrum. Among other things, each lens may be tuned for passage of one specific band of wavelength. Since each lens would therefore not need to pass the entire light spectrum, the number of elements may be reduced, for example, to one or two.

Further, due to the focused bandwidth for each lens, each of the lenses may be dyed during the manufacturing process for its respective bandwidth (e.g., red for the array targeting the red band of visible spectrum). Alternatively, a single color filter may be applied across each lens. This process eliminates the traditional color filters (such as the sheet of individual pixel filters) thereby reducing cost, improving signal strength and eliminating the pixel reduction barrier.

The above-described devices can include any suitable number of combinations, including as few as two arrays/lenses, and many more than two arrays/lenses. Examples include: two arrays/lenses configured as red/green and blue; two arrays/lenses configured as red and blue/green; two arrays/lenses configured as red, green, blue; four arrays/lenses configured as red, blue, green, emerald (for color enhancement); four arrays/lenses configured as red, blue, green, infrared (for low light conditions); and eight arrays/lenses configured as double the above configurations for additional pixel count and image quality.

The cameras or camera subsystems described herein are intended to be emblematic of a generic appliance containing the digital camera subsystem. Thus, the description herein should be interpreted as being emblematic of still and video cameras, cell phones, other personal communications devices, surveillance equipment, automotive applications, computers, manufacturing and inspection devices, toys, plus a wide range of other and continuously expanding applications. Of course these alternative interpretations may or may not include the specific components as depicted herein. For example, the circuit board may not be unique to the camera function but rather the digital camera subsystem may be an add-on to an existing circuit board, such as in a cell phone.

Any or all of the methods and/or apparatus disclosed herein may be employed in any type of apparatus or process including, but not limited to still and video cameras, cell phones, other personal communications devices, surveillance equipment, automotive applications, computers, manufacturing and inspection devices, toys, plus a wide range of other and continuously expanding applications.

Although each array and the related signal processing circuitry is can be tailored to address a specific band of visible spectrum, and each lens may be tuned for passage of that one specific band of wavelength, there is no requirement that each such array and the related signal processing circuitry be tailored to address a specific band of the visible spectrum. Nor is there any requirement that each lens be tuned for passage of a specific band of wavelength or that each of the arrays be located on the same semiconductor device. Indeed, the embodiments described and illustrated herein, including the specific components thereof, need not employ wavelength-specific features. For example, the arrays and/or signal processing circuitry need not be tailored to address a specific wavelength or band of wavelengths.

Figure 13:
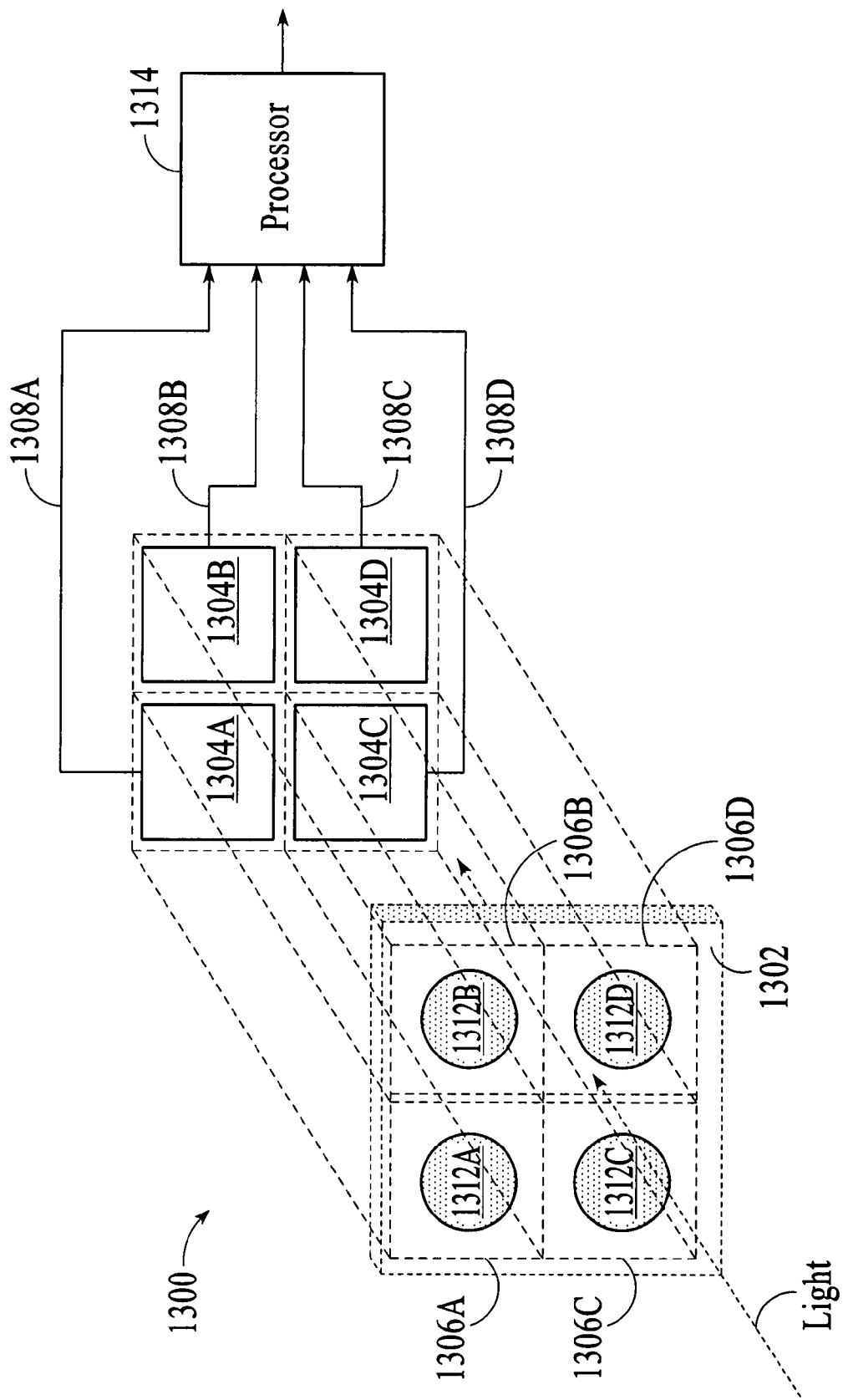
FIG. 13 is an exploded perspective view of a digital camera, under an embodiment.

FIG. 13 is an exploded perspective view of a digital camera 1300, under an embodiment. The digital camera apparatus 1300 includes one or more sensor arrays, e.g., four sensor arrays 1304A-1304D, and one or more optics portions, e.g., four optics portions 1312A-1312D. Each of the optics portions 1304A-1304D may include a lens, and may be associated with a respective one of the sensor arrays sensor arrays 1304A-1304D. In some embodiments a support 1302, for example a frame, is provided to support the one or more optics portions 1312A-1312D, at least in part. Each sensor array and the respective optics portion may define an optical channel. For example, an optical channel 1306A may be defined by the optics portion 1312A and the sensor array 1304A. An optical channel 1306B may be defined by the optics portion 1312B and the sensor array 1304B. An optical channel 1306C may be defined by optics portion 1312C and the sensor array 1304C. An optical channel 1306D may be defined by optics portion 1312D and a sensor array 1304D. The optics portions of the one or more optical channels are also collectively referred to as an optics subsystem.

The sensor arrays of the one or more optical channels are collectively referred as a sensor subsystem. The two or more sensor arrays may be integrated in or disposed on a common substrate, referred to as an image device, on separate substrates, or any combination thereof. For example, where the system includes three or more sensor arrays, two or more sensor arrays may be integrated in a first substrate, and one or more other sensor arrays may be integrated in or disposed on a second substrate.

In that regard, the one or more sensor arrays 1304A-1304D, may or may not be disposed on a common substrate. For example, in some embodiments two or more of the sensor arrays are disposed on a common substrate. In some embodiments, however, one or more of the sensor arrays is not disposed on the same substrate as one or more of the other sensor arrays. The one or more optical channels may or may not be identical to one another.

In some embodiments, one of the optical channels 1306 detects red light, one of the optical channels 1306 detects green light, and one of the optical channels 1306 detects blue light. In some of such embodiments, one of the optical channels 1306 detects infrared light, cyan light, or emerald light. In some other embodiments, one of the optical channels 1306 detects cyan light, one of the optical channels 1306 detects yellow light, one of the optical channels 1306 detects magenta light and one of the optical channels 1306 detects clear light (black and white). Any other wavelength or band of wavelengths (whether visible or invisible) combinations can also be used.

A processor 1314 is coupled to the one or more sensor arrays 1304A-1304D, via one or more communication links, e.g., communication links 1308A-1308D, respectively. A communication link may be any kind of communication link including but not limited to, for example, wired (e.g., conductors, fiber optic cables) or wireless (e.g., acoustic links, electromagnetic links or any combination thereof including but not limited to microwave links, satellite links, infrared links), and combinations thereof, each of which may be public or private, dedicated and/or shared (e.g., a network). A communication link may include for example circuit switching or packet switching or combinations thereof. Other examples of communication links include dedicated point-to-point systems, wired networks, and cellular telephone systems. A communication link may employ any protocol or combination of protocols including but not limited to the Internet Protocol.

The communication link may transmit any type of information. The information may have any form, including, for example, but not limited to, analog and/or digital) e.g., a sequence of binary values, or a bit string). The information may or may not be divided into blocks. If divided into blocks, the amount of information in a block may be predetermined or determined dynamically, and/or may be fixed (e.g., uniform) or variable.

As will be further described hereinafter, the processor may include one or more channel processors, each of which is coupled to a respective one (or more) of the optical channels and generates an image based at least in part on the signal(s) received from the respective optical channel, although this is not required. In some embodiments, one or more of the channel processors is tailored to its respective optical channel, for example, as described herein. For example, when one of the optical channels is dedicated to a specific wavelength or color (or band of wavelengths or colors) the respective channel processor may be adapted or tailored to such wavelength or color (or band of wavelengths or colors). Further, the gain, noise reduction, dynamic range, linearity and/or any other characteristic of the processor, or combinations of such characteristics, may be adapted to improve and/or optimize the processor to such wavelength or color (or band of wavelengths or colors). Tailoring the channel processing to the respective optical channel may facilitate generating an image of a quality that is higher than the quality of images resulting from traditional image sensors of like pixel count. In addition, providing each optical channel with a dedicated channel processor may help to reduce or simplify the amount of logic in the channel processors as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme.

In operation, an optics portion of a optical channel receives light from within a field of view and transmits one or more portions of such light, e.g., in the form of an image at an image plane. The sensor array receives one or more portions of the light transmitted by the optics portion and provides one or more output signals indicative thereof. The one or more output signals from the sensor array are supplied to the processor. In some embodiments, the processor generates one or more output signals based, at least in part, on the one or more signals from the sensor array. In some other embodiments, the processor may generate a combined image based, at least in part, on the images from two or more of such optical channels.

Although the processor 1314 is shown separate from the one or more sensor arrays 1304A-1304D, the processor 1314, or portions thereof, may have any configuration and may be disposed in one or more locations. For example, certain operations of the processor may be distributed to or performed by circuitry that is integrated in or disposed on the same substrate or substrates as one or more of the one or more of the sensor arrays and certain operations of the processor are distributed to or performed by circuitry that is integrated in or disposed on one or more substrates that are different from (whether such one or more different substrates are physically located within the camera or not) the substrates the one or more of the sensor arrays are integrated in or disposed on.

The digital camera apparatus 1300 may or may not include a shutter, a flash and/or a frame to hold the components together.

Figure 14A:
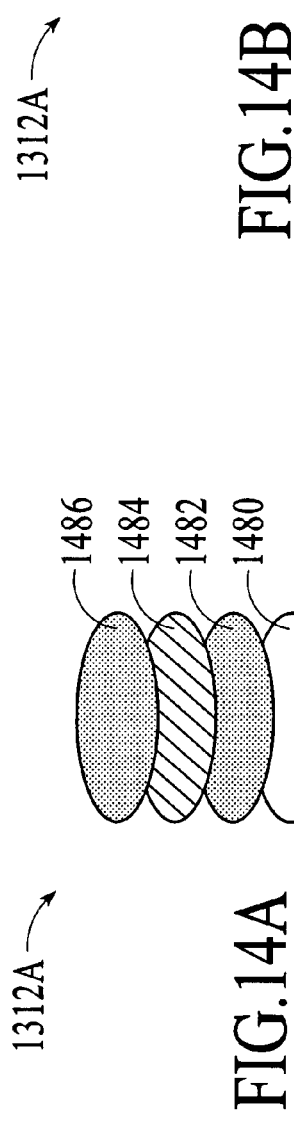
FIGS. 14A-14D are schematic exploded representations of one embodiment of an optics portion, under an embodiment.

FIGS. 14A-14D are schematic exploded representations of one embodiment of an optics portion, such as optic portion 1312A, under an embodiment. In FIG. 14A, the optics portion 1312A includes one or more lenses, e.g., a complex aspherical lens module 1480, one or more color coatings, e.g., a color coating 1482, one or more masks, e.g., an auto focus mask 1484, and one or more IR coatings, e.g., an IR coating 1486.

Lenses can comprise any suitable material or materials, including for example, glass and plastic. Lenses can be doped in any suitable manner, such as to impart a color filtering, polarization, or other property. Lenses can be rigid or flexible. In this regard, some embodiments employ a lens (or lenses) having a dye coating, a dye diffused in an optical medium (e.g., a lens or lenses), a substantially uniform color filter and/or any other filtering technique through which light passes to the underlying array.

The color coating 1482 helps the optics portion filter (or substantially attenuate) one or more wavelengths or bands of wavelengths. The auto focus mask 1484 may define one or more interference patterns that help the digital camera apparatus perform one or more auto focus functions. The IR coating 1486 helps the optics portion 1312A filter a wavelength or band of wavelength in the IR portion of the spectrum.

The one or more color coatings, e.g., color coating 1482, one or more masks, e.g., mask 1484, and one or more IR coatings, e.g., IR coating 1486 may have any size, shape and/or configuration.

Figure 14B:
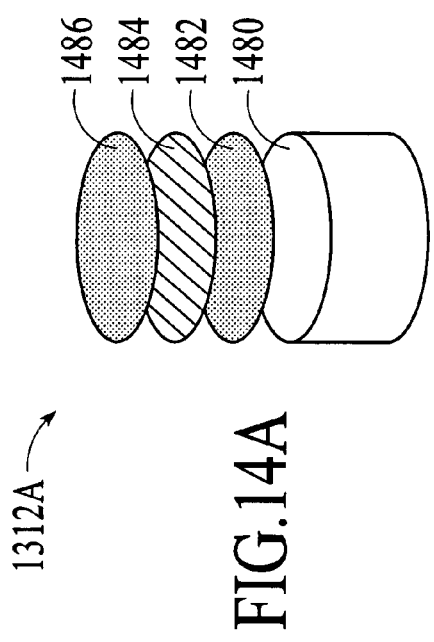

In some embodiments, as shown in FIG. 14B, one or more of the one or more color coatings, e.g., the color coating 1482, are disposed at the top of the optics portion. Some embodiments of the optics portion (and/or components thereof) may or may not include the one or more color coatings, one or more masks and one or more IR coatings and may or may not include features in addition thereto or in place thereof.

Figure 14C:
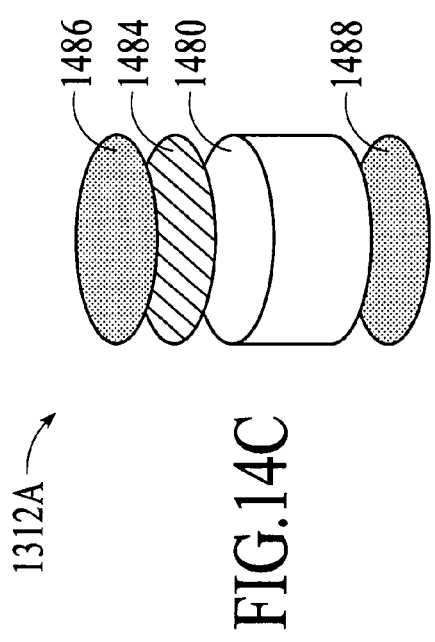
Figure 14D:
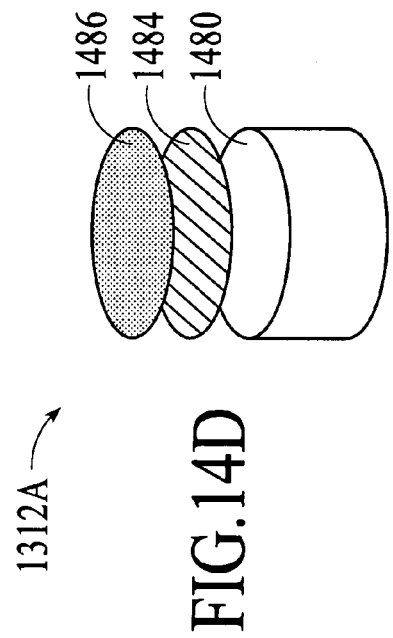

In some embodiments, as shown in FIG. 14C, one or more of the one or more color coatings, e.g., the color coating 1482, are replaced by one or more filters 1488 disposed in the optics portion, e.g., disposed below the lens. In other embodiments, as shown in FIG. 14D, one or more of the color coatings are replaced by one or more dyes diffused in the lens.

The one or more optics portions, e.g., optics portions 1312A-1312D of FIG. 13, may or may not be identical to one another. In some embodiments, for example, the optics portions are identical to one another. In some other embodiments, one or more of the optics portions are different, in one or more respects, from one or more of the other optics portions. For example, in some embodiments, one or more of the characteristics (for example, but not limited to, its type of element(s), size, response, and/or performance) of one or more of the optics portions is tailored to the respective sensor array and/or to help achieve a desired result. For example, if a particular optical channel is dedicated to a particular color (or band of colors) or wavelength (or band of wavelengths) then the optics portion for that optical channel may be adapted to transmit only that particular color (or band of colors) or wavelength (or band of wavelengths) to the sensor array of the particular optical channel and/or to filter out one or more other colors or wavelengths. In some of such embodiments, the design of an optical portion is optimized for the respective wavelength or bands of wavelengths to which the respective optical channel is dedicated. It should be understood, however, that any other configurations may also be employed. Each of the one or more optics portions may have any configuration.

In some embodiments, each of the optics portions, e.g., optics portions 1312A-1312D of FIG. 13, comprises a single lens element or a stack of lens elements (or lenslets), although, as stated above. For example, in some embodiments, a single lens element, multiple lens elements and/or compound lenses, with or without one or more filters, prisms and/or masks are employed.

An optical portion can also contain other optical features that are desired for digital camera functionality and/or performance. For example, these features can include electronically tunable filters, polarizers, wavefront coding, spatial filters (masks), and other features not yet anticipated. Some of the features (in addition to the lenses) are electrically operated (such as a tunable filter), or are mechanically movable with MEMs mechanisms.

In some embodiments, one or more photochromic (or photochromatic) materials are employed in one or more of the optical portions. The one or more materials may be incorporated into an optical lens element or as another feature in the optical path, for example, above one or more of the sensor arrays. In some embodiments, photochromatic materials may be incorporated into a cover glass at the camera entrance (common aperture) to all optics (common to all optical channels), or put into the lenses of one or more optical channels, or into one or more of the other optical features included into the optical path of an optics portion over any sensor array.

FIGS. 15A-15C are schematic representations of one embodiment of a sensor array 1504. The sensor array is similar to one of the sensor arrays 1304A-1304D of FIG. 13, foe example. As shown in FIG. 15A, the sensor array 1504 is coupled to circuits 1570, 1572, and 1574. The sensor array sensor array 1504 captures light and converts it into one or more signals, such as electrical signals, which are supplied to one or more of the circuits 1570, 1572, and 1574. The sensor array 1504 includes a plurality of sensor elements such as for example, a plurality of identical photo detectors (sometimes referred to as "picture elements" or "pixels"), e.g., pixels $1580_{1,1}$-$1580_{n,m}$. The photo detectors $1580_{1,1}$-$1580_{n,m}$ are arranged in an array, for example a matrix-type array. The number of pixels in the array may be, for example, in a range from hundreds of thousands to millions. The pixels may be arranged for example, in a two-dimensional array configuration, for example, having a plurality of rows and a plurality of columns, e.g., 640×480, 1280×1024, etc. However, the pixels can be sized and dimensioned as desired, and can be distributed in any desired pattern. Pixels that are distributed without any regular pattern can also used. Referring to FIG. 15B, a pixel, for example pixel $1580_{1,1}$, may be viewed as having x and y dimensions, although the photon capturing portion of a pixel may or may not occupy the entire area of the pixel and may or may not have a regular shape. In some embodiments, the sensor elements are disposed in a plane, referred to herein as a sensor plane. The sensor may have orthogonal sensor reference axes, including for example, an x-axis, a y-axis, and a z-axis, and may be configured so as to have the sensor plane parallel to the x-y plane XY and directed toward the optics portion of the optical channel. Each optical channel has a field of view corresponding to an expanse viewable by the sensor array. Each of the sensor elements may be associated with a respective portion of the field of view.

The sensor array may employ any type of technology, for example, but not limited to MOS pixel technologies (e.g., one or more portions of the sensor are implemented in "Metal Oxide Semiconductor" technology), charge coupled device (CCD) pixel technologies, or combination of both. The sensor array may comprise any suitable material or materials, including, but not limited to, silicon, germanium and/or combinations thereof. The sensor elements or pixels may be formed in any suitable manner.

In operation, the sensor array 1504A, is exposed to light on a sequential line per line basis (similar to a scanner, for example) or globally (similar to conventional film camera exposure, for example). After being exposed to light for certain period of time (exposure time), the pixels $1580_{1,1}$-$1580_{n,m}$, are read out, e.g., on a sequential line per line basis.

In some embodiments, circuitry 1570, also referred to as column logic 1570, is used to read the signals from the pixels $1580_{1,1}$-$1580_{n,m}$. FIG. 15C is a schematic representation of a pixel circuit. The pixels $1580_{1,1}$-$1580_{n,m}$, also referred to as sensor elements, may be accessed one row at a time by asserting one of the word lines 1582, which run horizontally through the sensor array 1504A. A single pixel $1580_{1,1}$ is shown. Data is passed into and/or out of the pixel $1580_{1,1}$ via bit lines (such as bit line 1584) which run vertically through the sensor array 1504A.

The pixels are not limited to the configurations shown in FIGS. 15A-15C. As stated above, each of the one or more sensor arrays may have any configuration (e.g., size, shape, pixel design).

The sensor arrays 1302A-1302D of FIG. 13 may or may not be identical to one another. In some embodiments, for example, the sensor arrays are identical to one another. In some other embodiments, one or more of the sensor arrays are different, in one or more respects, from one or more of the other sensor arrays. For example, in some embodiments, one or more of the characteristics (for example, but not limited to, its type of element(s), size (for example, surface area), and/or performance) of one or more of the sensor arrays is tailored to the respective optics portion and/or to help achieve a desired result.

Figure 16:
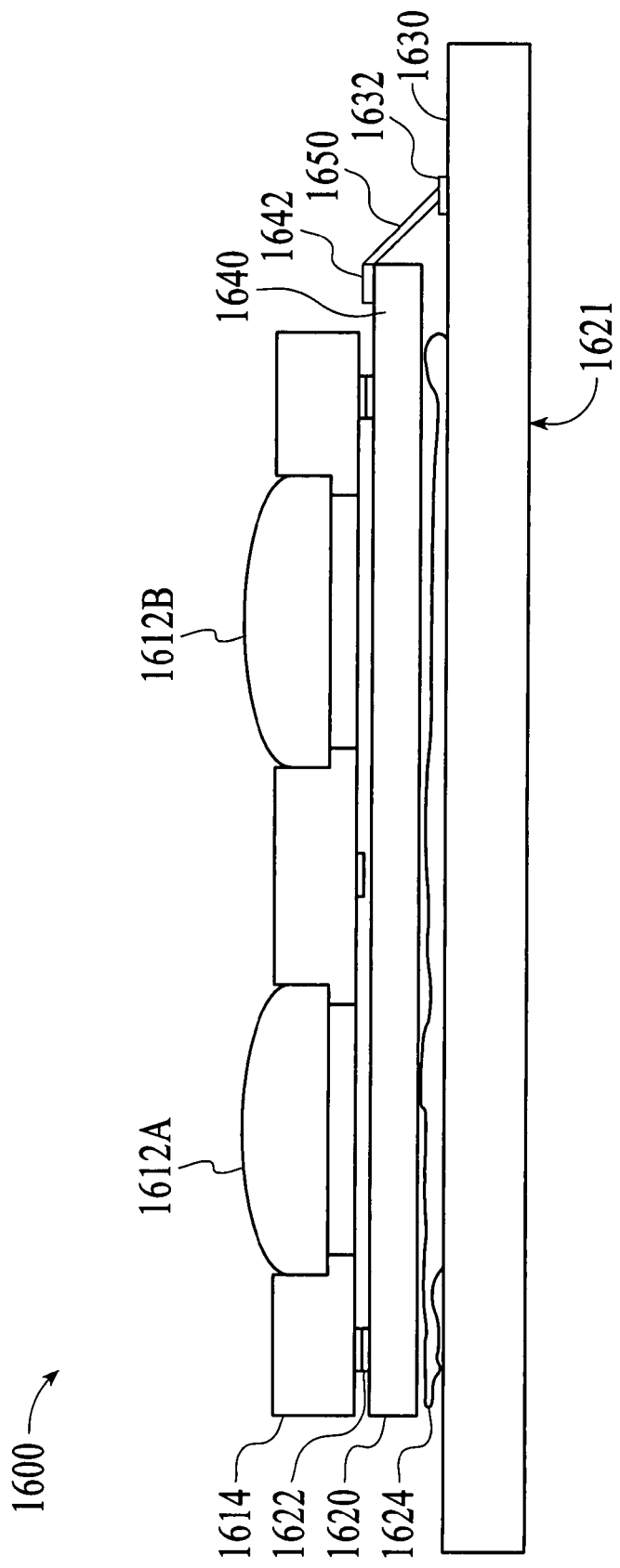
FIG. 16 is a schematic cross-sectional view of a digital camera apparatus, under an embodiment.

FIG. 16 is a schematic cross-sectional view of a digital camera apparatus 1600 including a printed circuit board 1620 of a digital camera on which the digital camera elements are mounted, under an embodiment. In this embodiment, the one or more optics portions, e.g., optics portions 1612A and 1612B are seated in and/or affixed to a support 1614. The support 1614 (for example a frame) is disposed superjacent a first bond layer 1622, which is disposed superjacent an image device 1620, in or on which sensor portions 1612A-1612D (sensor portions 1612C and 1612D are not shown), are disposed and/or integrated. The image device 1620 is disposed superjacent a second bond layer 1624 which is disposed superjacent the printed circuit board 1621.

The printed circuit board 1621 includes a major outer surface 1630 that defines a mounting region on which the image device 1620 is mounted. The major outer surface 1630 may further define and one or more additional mounting regions (not shown) on which one or more additional devices used in the digital camera may be mounted. One or more pads 1632 are provided on the major outer surface 1630 of the printed circuit board to connect to one or more of the devices mounted thereon.

The image device 1620 includes the one or more sensor arrays (not shown), and one or more electrically conductive layers. In some embodiments, the image device 1620 further includes one, some or all portions of a processor for the digital camera apparatus 1600. The image device 1620 further includes a major outer surface 1640 that defines a mounting region on which the support 1614 is mounted.

The one or more electrically conductive layers may be patterned to define one or more pads 1642 and one or more traces (not shown) that connect the one or more pads to one or more of the one or more sensor arrays. The pads 1642 are disposed, for example, in the vicinity of the perimeter of the image device 1620, for example along one, two, three or four sides of the image device 1620. The one or more conductive layers may comprise, for example, copper, copper foil, and/or any other suitably conductive material(s).

A plurality of electrical conductors 1650 may connect one or more of the pads 1642 on the image device 1620 to one or more of the pads 1632 on the circuit board 1621. The conductors 1650 may be used, for example, to connect one or more circuits on the image device 1620 to one or more circuits on the printed circuit board 1621.

The first and second bond layers 1622 and 1624 may comprise any suitable material(s), including but not limited to adhesive, and may comprise any suitable configuration. The first and second bond layers 1622, 1624 may comprise the same material(s) although this is not required. As used herein, a bond layer may be continuous or discontinuous. For example, a conductive layer may be an etched printed circuit layer. Moreover, a bond layer may or may not be planar or even substantially planar. For example, a conformal bond layer on a non-planar surface will be non-planar.

Figure 17:
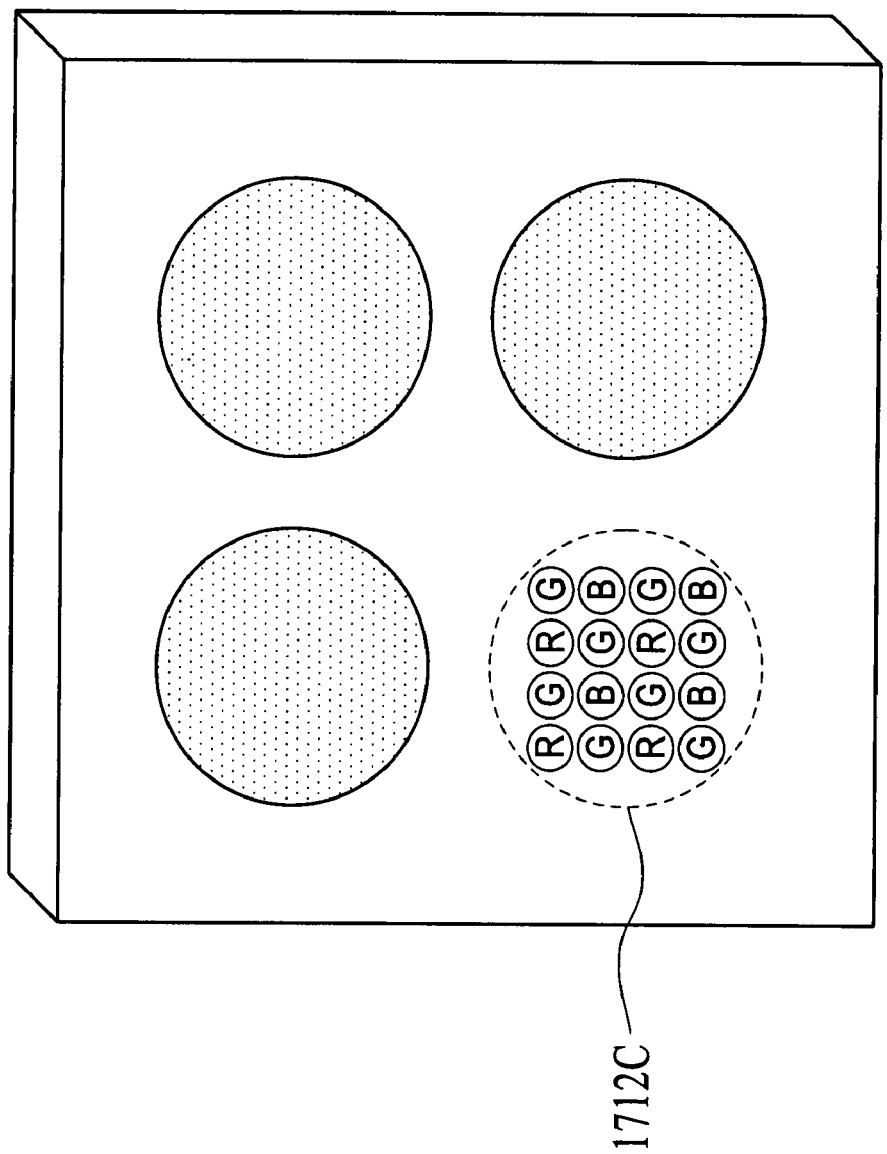
FIG. 17 is a schematic perspective view of a digital camera apparatus having one or more optics portions with the capability to provide color separation, under an embodiment.

FIG. 17 is a schematic perspective view of a digital camera apparatus having one or more optics portions with the capability to provide color separation in accordance with one embodiment of the present invention. In some of such embodiments, one or more of the optics portions, e.g., optics portion 1712C includes an array of color filters, for example, but not limited to a Bayer patter. In some of such embodiments, one or more of the optics portions, e.g., optics portion 1712C has the capability to provide color separation similar to that which is provided by a color filter array.

In some embodiments, the lens and/or filter of the optical channel may transmit both of such colors or bands of colors, and the optical channel may include one or more mechanisms elsewhere in the optical channel to separate the two colors or two bands of colors. For example, a color filter array may be disposed between the lens and the sensor array, and/or the optical channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures and/or characteristics that make them selective, such that the first photodiode has a higher sensitivity to the first color or first band of colors than to the second color or band of colors, and the second photodiode has a higher sensitivity to the second color or second band of colors than to the first color or first band of colors. Alternatively, the photodiodes are disposed at different depths in the pixel, taking advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed, even though the pixels may see only one particular color or band of colors, for example, to in order to adapt such sensor array to the particular color or band of colors.

Figure 18A:
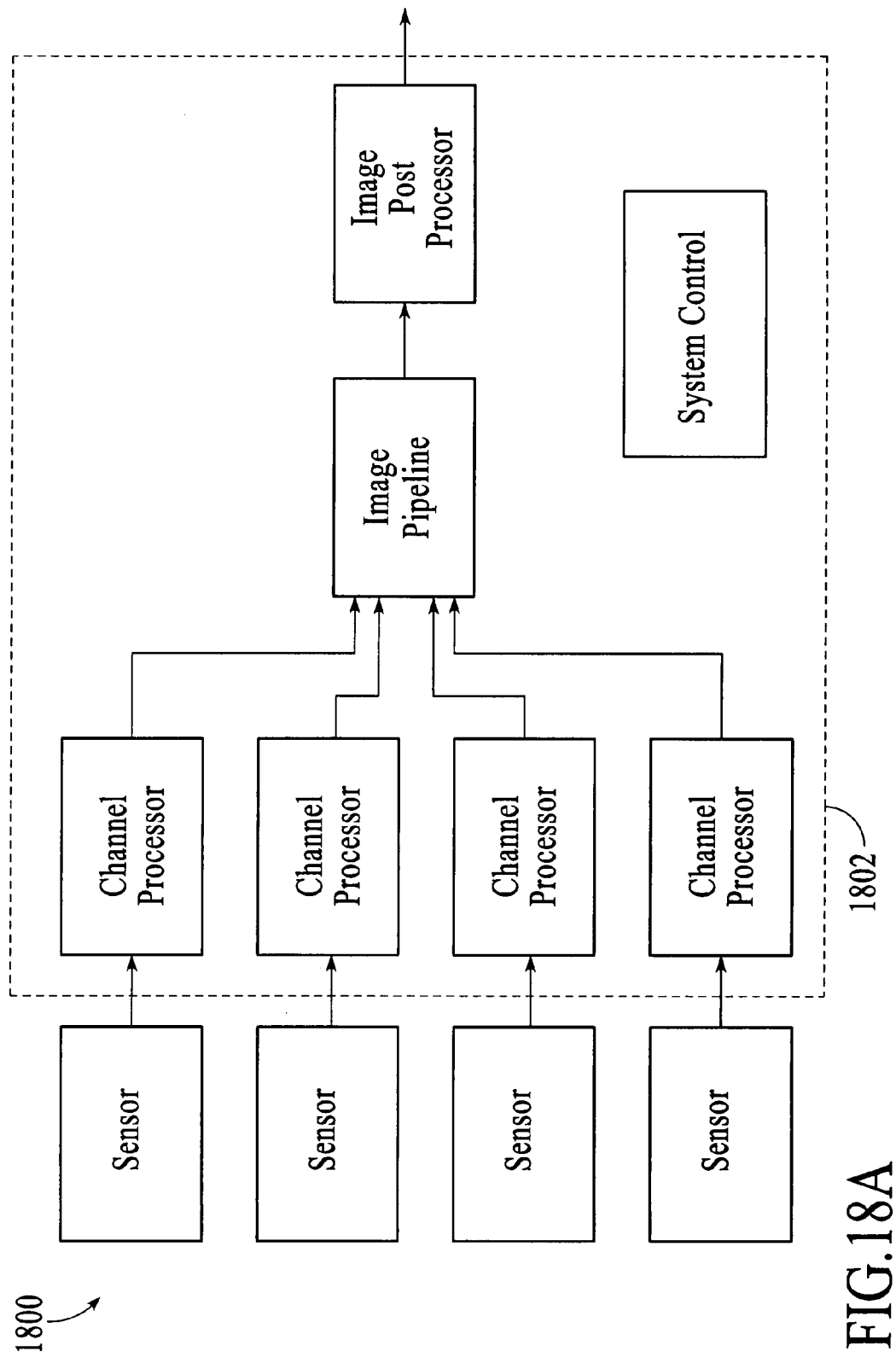
FIG. 18A is a block diagram of a processor of a digital camera subsystem, under an embodiment.

FIG. 18A is a block diagram of a processor 1802 of a digital camera subsystem 1800, under an embodiment. In this embodiment, the processor 1802 includes one or more channel processors, one or more image pipelines, and/or one or more image post processors. Each of the channel processors is coupled to a respective one of the optical channels (not shown) and generates an image based at least in part on the signal(s) received from the respective optical channel. In some embodiments the processor 1802 generates a combined imaged based at least in part on the images from two or more of the optical channels. In some embodiments, one or more of the channel processors are tailored to its respective optical channel, as previously described.

In various embodiments, the gain, noise reduction, dynamic range, linearity and/or any other characteristic of the processor, or combinations of such characteristics, may be adapted to improve and/or optimize the processor to a wavelength or color (or band of wavelengths or colors). Tailoring the channel processing to the respective optical channel makes it possible to generate an image of a quality that is higher than the quality of images resulting from traditional image sensors of like pixel count. In such embodiments, providing each optical channel with a dedicated channel processor helps to reduce or simplify the amount of logic in the channel processors, as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme The images (and/or data which is representative thereof) generated by the channel processors are supplied to the image pipeline, which may combine the images to form a full color or black/white image. The output of the image pipeline is supplied to the post processor, which generates output data in accordance with one or more output formats.

Figure 18B:
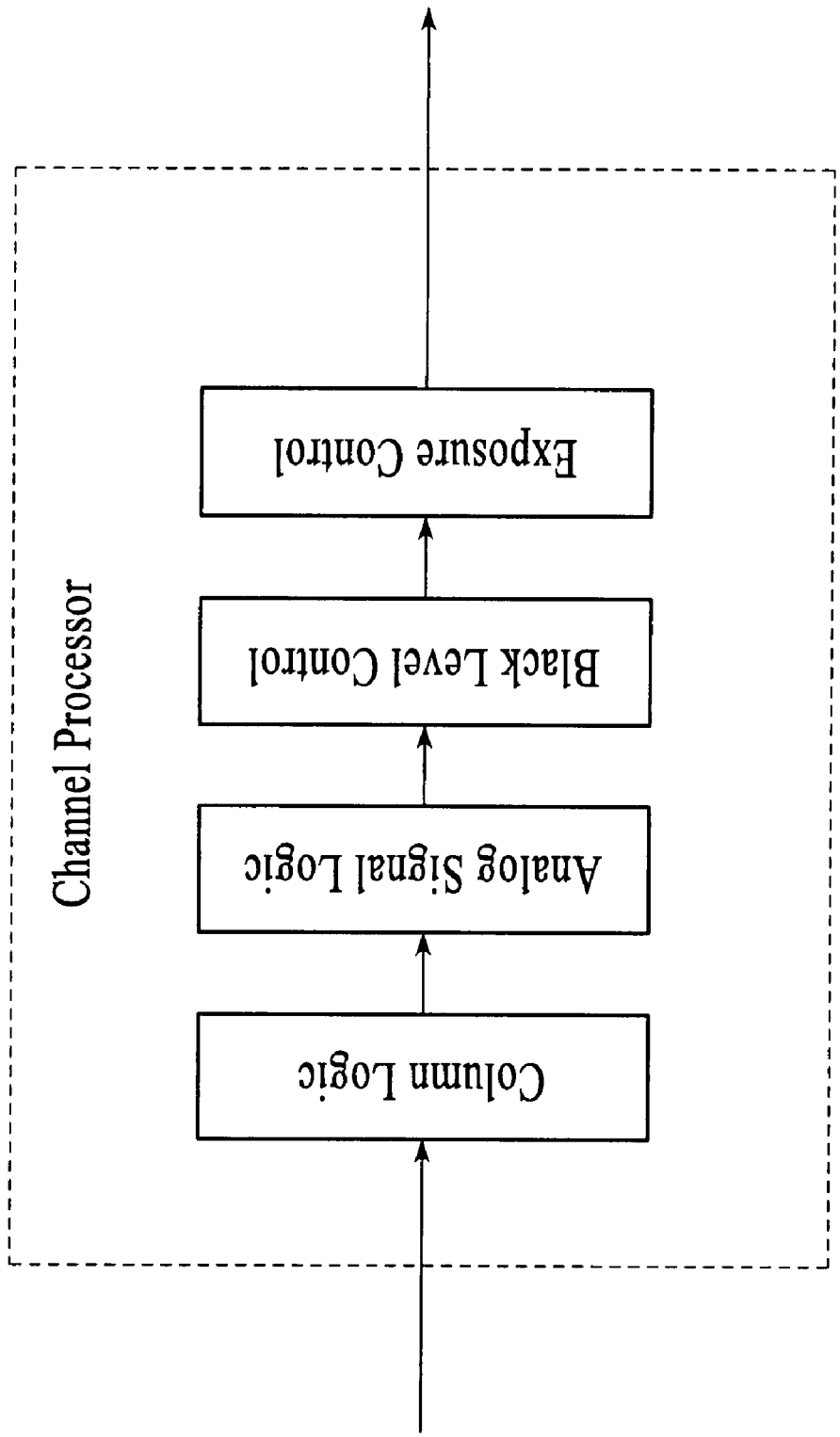
FIG. 18B is a block diagram of a channel processor of a digital camera subsystem, under an embodiment.

FIG. 18B shows one embodiment of a channel processor. In this embodiment, the channel processor includes column logic, analog signal logic, and black level control and exposure control. The column logic is coupled to the sensor and reads the signals from the pixels. Each of the column logic, analog signal logic, black level control and exposure control can be configured for processing as appropriate to the corresponding optical channel configuration (e.g., specific wavelength or color, etc.). For example, the analog signal logic is optimized, if desired, for processing. Therefore, gain, noise, dynamic range and/or linearity, etc., are optimized as appropriate to the corresponding optical channel configuration (e.g., a specific wavelength or color, etc.). As another example, the column logic may employ an integration time or integration times adapted to provide a particular dynamic range as appropriate to the corresponding optical channel.

The digital camera systems of an embodiment provide digital cameras with large effective single-frame dynamic exposure ranges through the use of multiple camera channels, including multiple optics and image sensors. The multiple camera channels are all configured to image the same field of view simultaneously, and each operates independently under a different integration time. The digital camera can include, for example, a 3×3 assembly of image sensors, perhaps three sensor of each color (e.g., red (R), green (G), and blue (B)) and the integration time of the sensors associated with each color can be varied, for example, each color can have three distinct values (e.g., 0.1 msec, 1 msec, and 10 msec integration time, respectively). The data from all sensors can be digitally combined to provide a much greater dynamic range within one frame of digital camera data. The raw digital camera data could be used by digital signal processing of the scene. The digital data can also be stored and displayed to exhibit low light or bright light characteristics as desired.

Exposure is the total amount of light allowed to fall on a sensor during the process of taking a photograph. Exposure control is control of the total amount of light incident on a sensor during the process of taking a photograph.

In contrast to exposure control, which is used by conventional digital cameras to manage dynamic range, the digital camera systems of an embodiment use integration time control to control the time the electrical signal is integrated on a charge storage device (capacitance) within a sensor (pixel), as described herein. Integration time control, also referred to as "focal plane shutter" control, controls the time the electrical signal is integrated or accumulated by controlling a switch (e.g., charge integration switch) coupled or connected to the sensor or a photo-detection mechanism of a sensor. For example, the charge integration switch is placed in a state to allow charge to accumulate within the sensor for a period of time approximately equal to the integration time corresponding to that sensor; upon completion of the integration period, the switch is placed in a state to transfer the accumulated charge as a photo-signal to a processing component. Digital camera components or circuitry are configured to allow independent control of the charge integration switch associated with each sensor, thereby making possible dynamic range control for each sensor. The integration time control can be executed (depending on readout configuration) according to a number of techniques, for example, rolling mode and/or snap-shot mode to name a few.

The output of the analog signal logic is supplied to the black level control, which determines the level of noise within the signal, and filters out some or all of such noise. If the sensor coupled to the channel processor is focused upon a narrower band of visible spectrum than traditional image sensors, the black level control can be more finely tuned to eliminate noise.

The output of the black level control is supplied to the exposure control, which measures the overall volume of light being captured by the array and adjusts the capture time for image quality. Traditional cameras must make this determination on a global basis (for all colors). In the camera of an embodiment, however, the exposure control can be specifically adapted to the wavelength (or band of wavelengths) to which the sensor is configured. Each channel processor is thus able to provide a capture time that is specifically adapted to the sensor and/or specific color (or band of colors) targeted, and which may be different than the capture time provided by another channel processor for another optical channel.

Figure 18C:
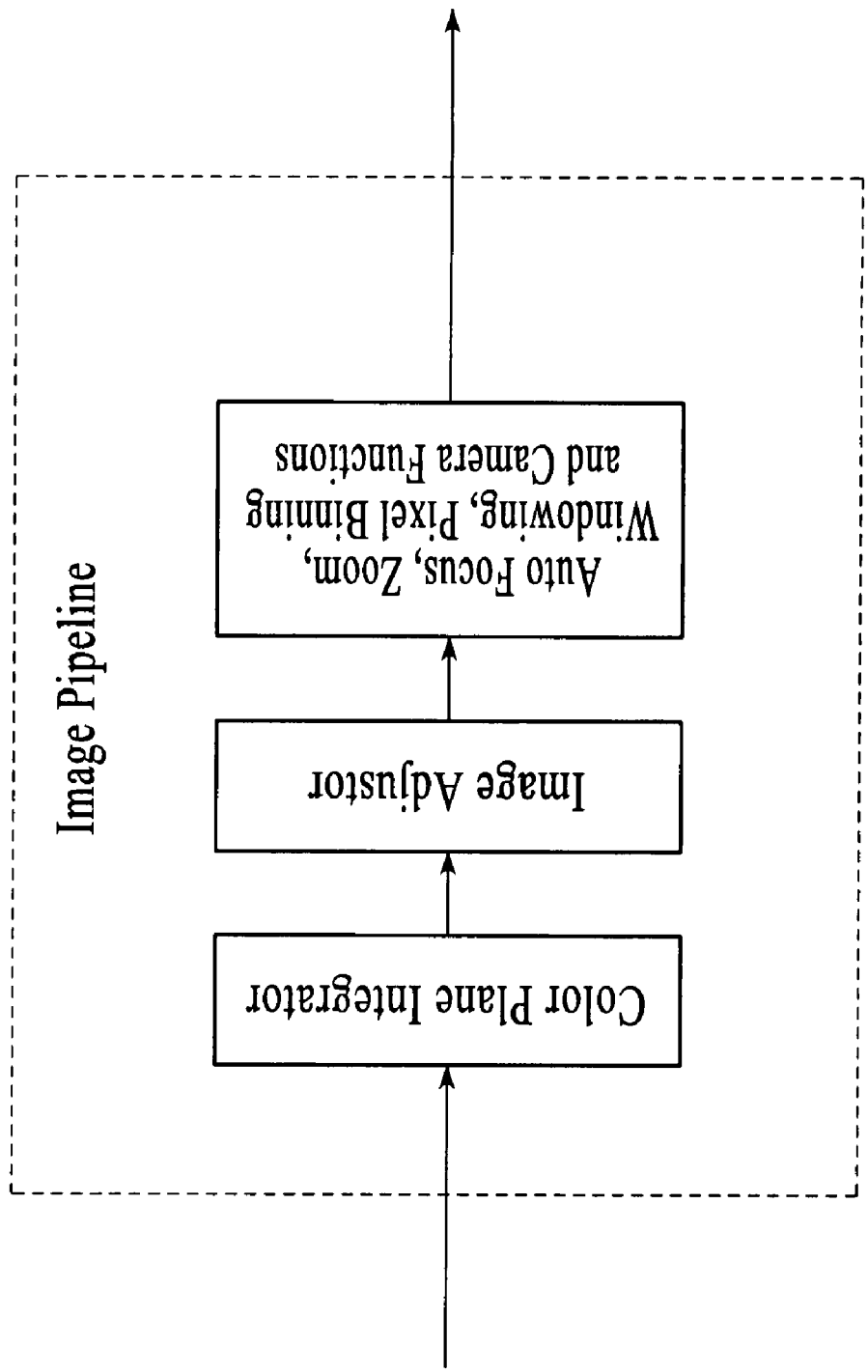
FIG. 18C is a block diagram of an image pipeline of a digital camera subsystem, under an embodiment.

FIG. 18C is a block diagram of the image pipeline, under an embodiment. In this embodiment, the image pipeline includes two portions. The first portion includes a color plane integrator and an image adjustor. The color plane integrator receives an output from each of the channel processors and integrates the multiple color planes into a single color image. The output of the color plane integrator, which is indicative of the single color image, is supplied to the image adjustor, which adjusts the single color image for saturation, sharpness, intensity and hue. The adjustor also adjusts the image to remove artifacts and any undesired effects related to bad pixels in the one or more color channels. The output of the image adjustor is supplied to the second portion of the pipeline, which provides auto focus, zoom, windowing, pixel binning and camera functions.

Figure 18D:
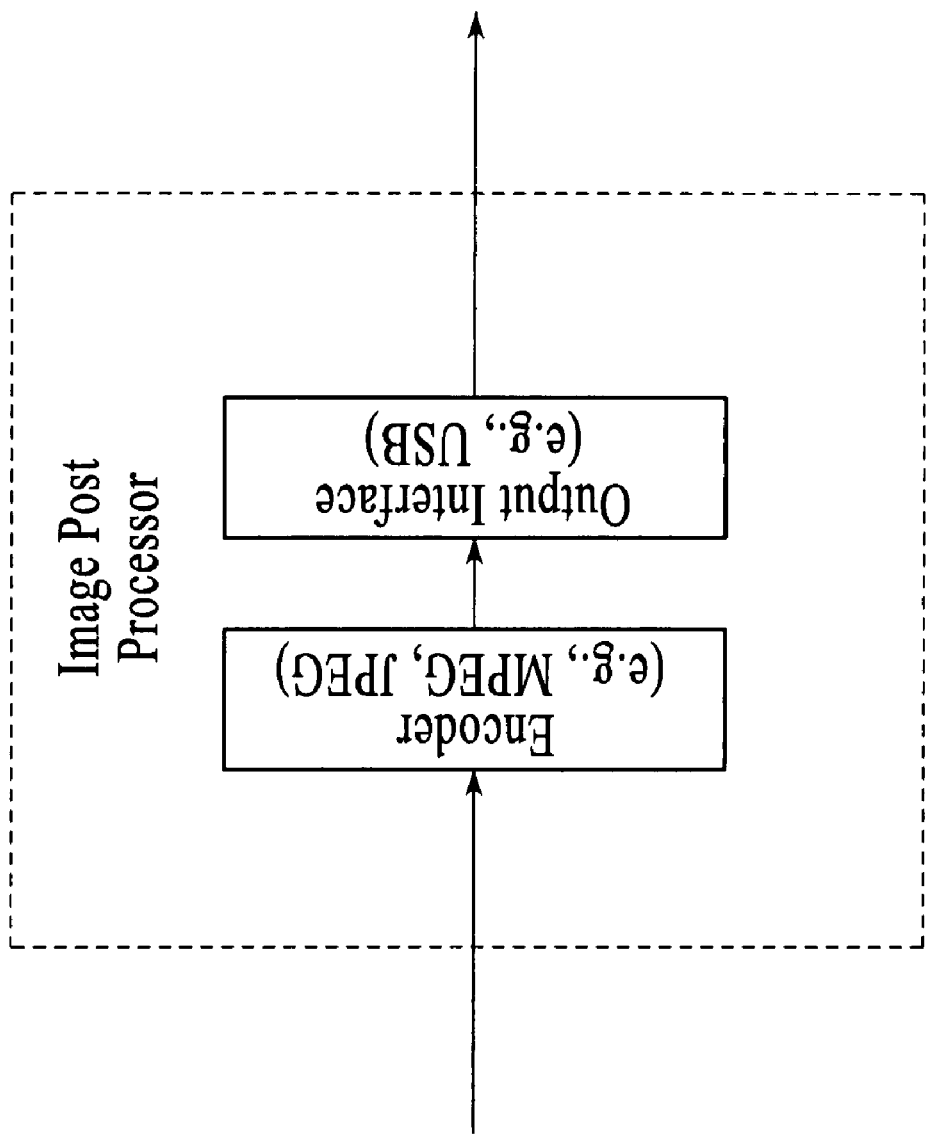
FIG. 18D is a block diagram of an image post processor of a digital camera subsystem, under an embodiment.

FIG. 18D is a block diagram of the image post processor, under an embodiment. In this embodiment, the image post processor includes an encoder and an output interface. The encoder receives the output signal from the image pipeline and provides encoding to supply an output signal in accordance with one or more standard protocols (e.g., MPEG and/or JPEG). The output of the encoder is supplied to the output interface, which provides encoding to supply an output signal in accordance with a standard output interface, e.g., universal serial bus (USB) interface.

Figure 19:
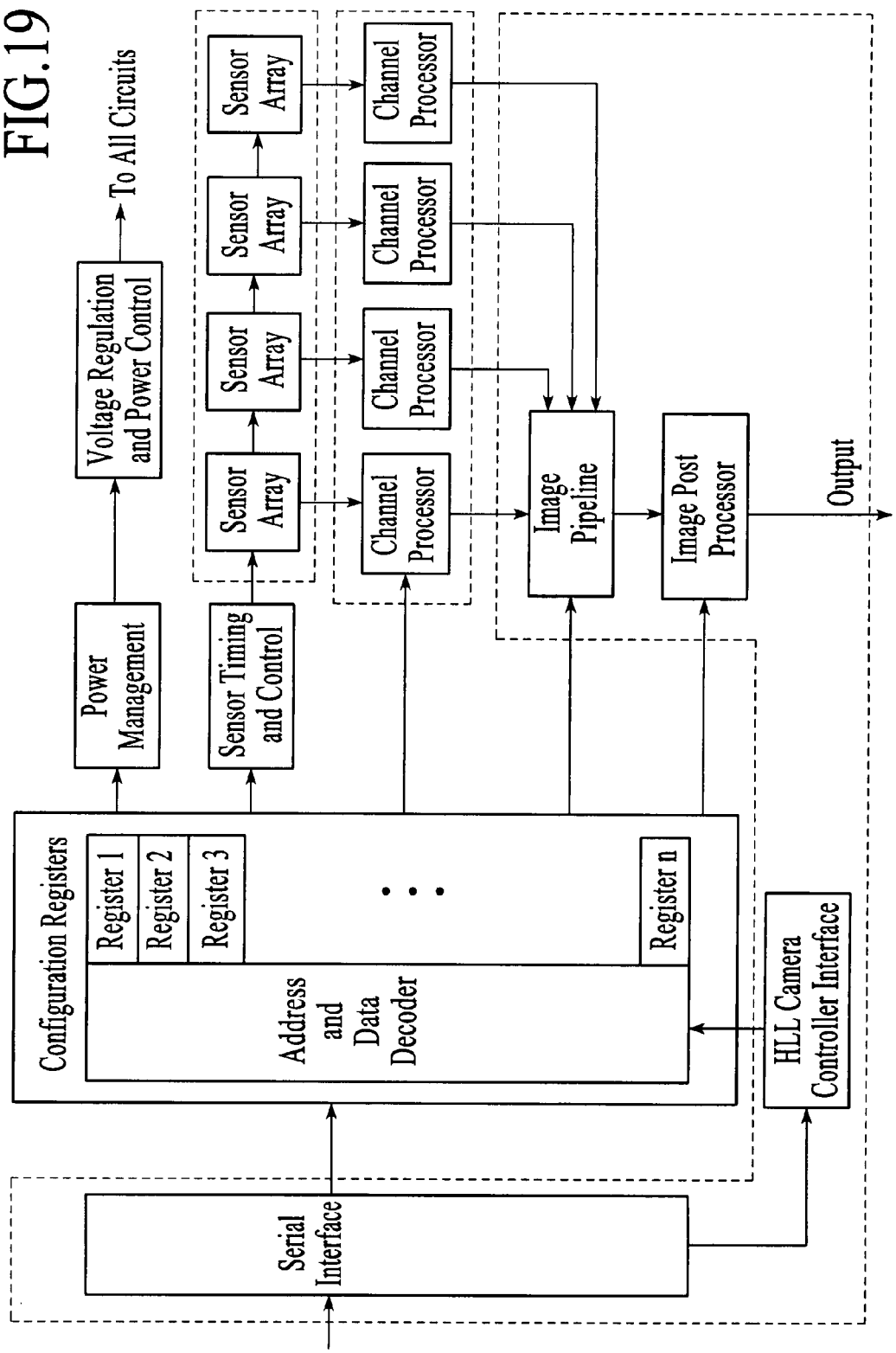
FIG. 19 is a block diagram of digital camera system, including system control components, under an embodiment.

FIG. 19 is a block diagram of digital camera system, including system control components, under an embodiment. The system control portion includes a serial interface, configuration registers, power management, voltage regulation and control, timing and control, a camera control interface and a serial interface, but is not so limited. In some embodiments, the camera interface comprises an interface that processes signals that are in the form of high level language (HLL) instructions. In some embodiments the camera interface comprises an interface that processes control signals that are in the form of low level language (LLL) instructions and/or of any other form now known or later developed. Some embodiments may process both HLL instructions and LLL instructions.

As used herein, the following terms are interpreted as described below, unless the context requires a different interpretation.

"Array" means a group of photodetectors, also know as pixels, which operate in concert to create one image. The array captures photons and converts the data to an electronic signal. The array outputs this raw data to signal processing circuitry that generates the image sensor image output.

"Digital Camera" means a single assembly that receives photons, converts them to electrical signals on a semiconductor device ("image sensor"), and processes those signals into an output that yields a photographic image. The digital camera would included any necessary lenses, image sensor, shutter, flash, signal processing circuitry, memory device, user interface features, power supply and any mechanical structure (e.g. circuit board, housing, etc) to house these components. A digital camera may be a stand-alone product or may be imbedded in other appliances, such as cell phones, computers or the myriad of other imaging platforms now available or to be created in the future, such as those that become feasible as a result of this invention.

"Digital Camera Subsystem" (DCS) means a single assembly that receives photons, converts them to electrical signals on a semiconductor device ("image sensor") and processes those signals into an output that yields a photographic image. The Digital Camera Subsystem includes any necessary lenses, image sensor, signal processing circuitry, shutter, flash and any frame to hold the components as may be required. The power supply, memory devices and any mechanical structure are not necessarily included.

"Electronic media" means that images are captured, processed and stored electronically as opposed to the use of film.

"Frame" or "thin plate" means the component of the DCS that is used to hold the lenses and mount to the image sensor.

"Image sensor" means the semiconductor device that includes the photon detectors ("pixels"), processing circuitry and output channels. The inputs are the photons and the output is the image data.

"Lens" means a single lens or series of stacked lenses (a column one above the other) that shape light rays above an individual array. When multiple stacks of lenses are employed over different arrays, they are called "lenses."

"Package" means a case or frame that an image sensor (or any semiconductor chip) is mounted in or on, which protects the imager and provides a hermetic seal. "Packageless" refers to those semiconductor chips that can be mounted directly to a circuit board without need of a package.

The terms "Photo-detector" and "pixels" mean an electronic device that senses and captures photons and converts them to electronic signals. These extremely small devices are used in large quantities (hundreds of thousands to millions) in a matrix to capture an image.

"Semiconductor Chip" means a discrete electronic device fabricated on a silicon or similar substrate, which is commonly used in virtually all electronic equipment.

"Signal Processing Circuitry" means the hardware and software within the image sensor that translates the photon input information into electronic signals and ultimately into an image output signal.

Aspects of the digital camera systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the digital camera systems and methods include: microcontrollers with memory (such as electronically erasable programmable read only memory (EEPROM)), embedded microprocessors, firmware, software, etc. Furthermore, aspects of the digital camera systems and methods may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that components of the various systems and methods disclosed herein may be described using computer aided design tools and expressed (or represented), as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof.

Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described systems and methods may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the digital camera systems and methods is not intended to be exhaustive or to limit the digital camera systems and methods to the precise form disclosed. While specific embodiments of, and examples for, the digital camera systems and methods are described herein for illustrative purposes, various equivalent modifications are possible within the scope of the digital camera systems and methods, as those skilled in the relevant art will recognize. The teachings of the digital camera systems and methods provided herein can be applied to other processing systems and methods, not only for the systems and methods described above.

The elements and acts of the various embodiments described above can be combined to provide further embodiments. These and other changes can be made to the digital camera systems and methods in light of the above detailed description.

In general, in the following claims, the terms used should not be construed to limit the digital camera systems and methods to the specific embodiments disclosed in the specification and the claims, but should be construed to include all systems that operate under the claims. Accordingly, the digital camera systems and methods are not limited by the disclosure, but instead the scope of the digital camera systems and methods is to be determined entirely by the claims.

While certain aspects of the digital camera systems and methods are presented below in certain claim forms, the inventors contemplate the various aspects of the digital camera systems and methods in any number of claim forms. Accordingly, the inventors reserve the right to add additional claims after filing the application to pursue such additional claim forms for other aspects of the digital camera systems and methods.

What is claimed is:

1. A digital camera comprising:
a plurality of channels, wherein each channel includes an optics component and an array of photo-detectors integrated on a semiconductor substrate, the plurality of channels including a first channel having a first field of view (FOV) comprising a first angular width of a scene imaged by the camera and a second channel having a second FOV comprising a second angular width of the scene imaged by the camera, wherein the first and second angular widths are different; and
a processing component coupled to the plurality of channels, the processing component configured to independently control simultaneous data acquisition with each of the plurality of channels, the processing component configured to combine data of a frame from at least one of the plurality of channels to provide an image having a relatively high resolution.

2. The digital camera of claim 1, wherein the optics component of the first channel has a first focal length, and the array of photo-detectors of the first channel has a first dimension.

3. The digital camera of claim 2, wherein the optics component of the second channel has a second focal length that is different from the first focal length, and the array of photo-detectors of the second channel has the first dimension.

4. The digital camera of claim 2, wherein the optics component of the second channel has the first focal length, and the array of photo-detectors of the second channel has a second dimension that is different from the first dimension.

5. The digital camera of claim 2, wherein the optics component of the second channel has a second focal length that is different from the first focal length, and the array of photo-detectors of the second channel has a second dimension that is different from the first dimension.

6. The digital camera of claim 1, wherein the plurality of channels comprises a third channel having a third FOV.

7. The digital camera of claim 6, wherein the third FOV is different from one or more of the first FOV and the second FOV.

8. The digital camera of claim 6, wherein the plurality of channels comprises a fourth channel having a fourth FOV.

9. The digital camera of claim 8, wherein the fourth FOV is different from one or more of the first FOV, the second FOV and the third FOV.

10. The digital camera of claim 1, wherein the processing component is configured to separately and simultaneously control a parameter of the optics component of each channel.

11. The digital camera of claim 1, wherein the optics component of the first channel includes a different configuration than the optics component of the second channel.

12. The digital camera of claim 1, wherein the optics component includes at least one lens.

13. The digital camera of claim 1, wherein the optics component includes at least one filter.

14. The digital camera of claim 1, wherein each channel is configured to pass light including a plurality of colors.

15. The digital camera of claim 1, wherein the first channel is configured to pass light of a first color and the second channel is configured to pass light of a second color.

16. The digital camera of claim 1, wherein the plurality of channels are configured to pass light of a first color.

17. A digital camera comprising:
a first channel including a first optics component and a first image sensor integrated in a semiconductor substrate and configured to provide a first field of view (FOV) that comprises a first angular width of a scene imaged by the camera;
a second channel including a second optics component and a second image sensor integrated in the semiconductor substrate and configured to provide a second FOV that comprises a second angular width of the scene imaged by the camera, wherein the first and second angular widths are different; and a processing component coupled to the first and second channels and configured to independently control simultaneous data acquisition with the first and second channels during a frame.

18. The digital camera of claim 17, wherein the first optics component has a first focal length, and the first image sensor has a first pixel count.

19. The digital camera of claim 18, wherein the second optics component has a second focal length that is different from the first focal length, and the second image sensor has the first pixel count.

20. The digital camera of claim 18, wherein the second optics component has the first focal length, and the second image sensor has a second pixel count that is different from the first pixel count.

21. The digital camera of claim 18, wherein the second optics component has a second focal length that is different from the first focal length, and the second image sensor has a second pixel count that is different from the first pixel count.

22. A method comprising:
configuring a first optics component relative to a first image sensor to form a first channel having a first field of view (FOV) that comprises a first angular width of a scene;
configuring a second optics component relative to a second image sensor to form a second channel having a second FOV that comprises a second angular width of the scene, wherein the first and second angular widths are different;
independently controlling simultaneous data acquisition with each of the first and second channels during a frame; and
combining data received during the frame from one or more of the first and second channels to provide an image.

23. The method of claim 22, comprising forming the first image sensor and the second image sensor in a semiconductor substrate.

24. The method of claim 22, wherein configuring the first optics component relative to the first image sensor comprises configuring the first optics component with a first focal length and configuring the first image sensor to include a first pixel count.

25. The method of claim 24, wherein configuring the second optics component relative to the second image sensor comprises configuring the second optics component with a second focal length that is different than the first focal length and configuring the second image sensor to include the first pixel count.

26. The method of claim 24, wherein configuring the second optics component relative to the second image sensor comprises configuring the second optics component with the first focal length and configuring the second image sensor to include a second pixel count that is different than the first pixel count.

27. The method of claim 24, wherein configuring the second optics component relative to the second image sensor comprises configuring the second optics component with a second focal length that is different from the first focal length and configuring the second image sensor to include a second pixel count that is different than the first pixel count.

28. The method of claim 22, comprising configuring a third optics component relative to a third image sensor to form a third channel having a third FOV, wherein the third FOV is different from one or more of the first FOV and the second FOV.

29. The method of claim 28, comprising forming the third image sensor in a semiconductor substrate along with the first and the second image sensors.

30. The method of claim 28, comprising configuring a fourth optics component relative to a fourth image sensor to form a fourth channel having a fourth FOV, wherein the fourth FOV is different from one or more of the first FOV, the second FOV and the third FOV.

31. The method of claim 30, comprising forming the fourth image sensor in a semiconductor substrate along with the first, the second and the third image sensors.

32. The method of claim 22, comprising separately and simultaneously controlling a parameter of one or more of the first and the second optics components.

33. The method of claim 22, wherein configuring the first optics component includes configuring the first optics component differently than the second optics component.

34. The method of claim 22, wherein configuring the first optics component includes configuring the first optics component to pass light of a same color as the second optics component.

35. The method of claim 22, wherein configuring the first optics component includes configuring the first optics component to pass light of a different color than the second optics component.

36. A method comprising:
forming a first image sensor and a second image sensor in a semiconductor substrate;
configuring a first optics component relative to the first image sensor to form a first channel having a first field of view (FOV) that comprises a first angular width of a scene;
configuring a second optics component relative to the second image sensor to form a second channel having a second FOV that comprises a second angular width of the scene, wherein the first and second angular widths are different; and
forming a processing component in the semiconductor substrate and configuring the processing component to independently control simultaneous data acquisition by the first and second channels during a frame.

37. A solid-state camera system produced according to a method comprising:
forming a first image sensor and a second image sensor in a semiconductor substrate;
configuring a first optics component relative to the first image sensor to form a first channel having a first field of view (FOV) that corresponds to a first angular width of a scene;
configuring a second optics component relative to the second image sensor to form a second channel having a second FOV that corresponds to a second angular width of the scene, wherein the first and second angular widths are different; and
forming a processing component in the semiconductor substrate and configuring the processing component to independently control simultaneous data acquisition by the first and second channels during a frame.

38. The digital camera of claim 1, wherein the processing component is further configured to generate a combined image based at least in part on data from both the first and second channels.

39. The digital camera of claim 1, wherein at least a portion of the first FOV overlaps with at least a portion of the second FOV.

* * * * *

UNITED STATES PATENT AND TRADEMARK OFFICE
CERTIFICATE OF CORRECTION

PATENT NO.         : 7,916,180 B2                                          Page 1 of 1
APPLICATION NO.    : 11/788279
DATED              : March 29, 2011
INVENTOR(S)        : Olsen et al.

It is certified that error appears in the above-identified patent and that said Letters Patent is hereby corrected as shown below:

Title page, item (65), under "Prior Publication Data", in Column 1, Line 1, delete "US 2010/0060746 A9 Mar. 11, 2010" and insert
-- US 2010/0060746 A9 Mar. 11, 2010
US 2008/0174670 A1 Jul. 24, 2008 --.

Page 2, item (56), under "Other Publications", in Column 2, Line 2, delete "Proc" and insert
-- Proc. --.

Page 2, item (56), under "Other Publications", in Column 2, Line 9, delete "so" and insert -- of --.

Page 2, item (56), under "Other Publications", in Column 2, Line 23, delete "Optcs," and insert -- Optics, --.

Signed and Sealed this
Sixteenth Day of August, 2011

David J. Kappos
*Director of the United States Patent and Trademark Office*